(12) United States Patent
Badaroglu

(10) Patent No.: US 7,987,382 B2
(45) Date of Patent: Jul. 26, 2011

(54) METHOD AND APPARATUS FOR MINIMIZING THE INFLUENCE OF A DIGITAL SUB-CIRCUIT ON AT LEAST PARTIALLY DIGITAL CIRCUITS

(75) Inventor: Mustafa Badaroglu, Leuven (BE)

(73) Assignee: IMEC, Leuven (BE)

( * ) Notice: Subject to any disclaimer, the term of this patent is extended or adjusted under 35 U.S.C. 154(b) by 571 days.

(21) Appl. No.: 11/486,978

(22) Filed: Jul. 13, 2006

(65) Prior Publication Data

US 2007/0035428 A1    Feb. 15, 2007

Related U.S. Application Data

(63) Continuation of application No. PCT/BE2005/000020, filed on Feb. 14, 2005.

(30) Foreign Application Priority Data

Feb. 13, 2004    (GB) .................................. 0403237.1

(51) Int. Cl.
*G06F 1/00* (2006.01)
*G06F 1/12* (2006.01)
*G06F 1/04* (2006.01)
*H03L 7/00* (2006.01)

(52) U.S. Cl. ........ 713/500; 713/400; 713/401; 713/503; 713/600; 327/141; 327/144; 327/153; 327/154

(58) Field of Classification Search .................. 713/400, 713/401, 500, 503, 600; 327/141, 144, 153, 327/154

See application file for complete search history.

(56) References Cited

U.S. PATENT DOCUMENTS

| 6,493,394 | B2 * | 12/2002 | Tamura et al. ................. 375/257 |
| 6,643,317 | B1 | 11/2003 | Blumer |
| 6,647,052 | B2 * | 11/2003 | Hailey .......................... 375/130 |
| 6,941,258 | B2 | 9/2005 | Van Heijningen et al. |
| 7,290,162 | B2 * | 10/2007 | Swarbrick et al. ............ 713/500 |

(Continued)

FOREIGN PATENT DOCUMENTS

EP    0 120 100    3/1983

(Continued)

OTHER PUBLICATIONS

Badaroglu (2004) Digital circuit capacitance and switching analysis for ground bounce in ICs with a high-ohmic substrate. IEEE Journal of Solid-State Circuits. 39(7):1119-1130.

(Continued)

*Primary Examiner* — Ji H Bae
(74) *Attorney, Agent, or Firm* — Knobbe Martens Olson & Bear LLP

(57) ABSTRACT

One inventive aspect relates to a digital sub-circuit suitable for embedding in an at least partially digital circuit for minimizing the influence of another digital sub-circuit on the at least partially digital circuit, the other digital sub-circuit being part of the at least partially digital circuit. The influence of the other digital sub-circuit may, for example, be the introduction of ground bounce by switching of the other digital sub-circuit. Another inventive aspect relates to an at least partially digital circuit comprising such a digital sub-circuit for minimizing the influence of another digital sub-circuit to the at least partially digital circuit and to a method for reducing the influence of another digital sub-circuit to an at least partially digital circuit.

38 Claims, 13 Drawing Sheets

U.S. PATENT DOCUMENTS

2003/0169086 A1* 9/2003 Lee et al. .................. 327/158

FOREIGN PATENT DOCUMENTS

WO     WO 01/04984 A1     1/2001

OTHER PUBLICATIONS

Badaroglu et al. (2002) Clock tree optimization in synchronous CMOS digital circuits for substrate noise reduction using folding of supply current transients. Proceedings 2002 Design Automation Conference, NY. pp. 399-404.

Badaroglu et al. (2002) Methodology and experimental verification for substrate noise reduction in CMOS mixed-signal ICs with synchronous digital circuits. Solid-State Circuits Conference, 2002. Digest of Technical Papers. 2002 IEEE International, Piscataway, NJ. 2:222-223, 483.

Badaroglu et al. (2002) Methodology and experimental verification for substrate noise reduction in CMOS mixed-signal ICs with synchronous digital circuits. IEEE Journal of Solid-State Circuits. 37(11):1383-1395.

Badaroglu et al. (2004) Digital ground bounce reduction by phase modulation of the clock. Design, Automation and Test in Europe Conference and Exhibition, Piscataway, NJ. 1:88-93.

Chang et al. (2003) A spread-spectrum clock generator with triangular modulation. IEEE Journal of Solid-State Circuits. 38(4):673-676.

Frye (2001) Integration and electrical isolation in CMOS mixed-signal wireless chips. Proceedings of the IEEE. 89(4):444-455.

Gabara et al. (1996) Forming damped LRC parasitic circuits in simultaneously switched CMOS output buffers. IEEE 1996 Custom Integrated Circuits Conference. pp. 277-280.

Hardin (1994) Spread spectrum clock generation for the reduction of radiated emission. IEEE International Symposium in Chicago, IL, New York, NY. pp. 227-231.

Heredia (2001) Spread spectrum clock—an EMC solution for new generation portable computers. Proceedings of INCEMIC 2001-2002. pp. 146-151.

Li et al. (1999) Dual-loop spread-spectrum clock generator. IEEE International Solid-State Circuits Conference, New York. 42:184-185, 459.

Michel et al. (1999) A frequency modulated PLL for EMI reduction in embedded application. ASIC/SOC Conference. Proceedings. Twelfth Annual IEEE International Washington, DC, Piscataway, NJ. pp. 362-365.

Neves et al. (1996) Design methodology for synthesizing clock distribution networks exploiting nonzero localized clock skew. IEEE Transactions on Very Large Scale Integration (VLSI) Systems. 4(2):286-291.

Neves et al. (1996) Optimal clock skew scheduling tolerant to process variations. University of Rochester, New York. pp. 623-628.

Rusu et al. (2003) A 1.5-GHz 130-nm Itanium® 2 Processor with 6-MB On-die L3 Cache. IEEE Journal of Solid-State Circuits. 38(11):1887-1895.

Sakiyama et al. (1997) A lean power management technique: the lowest power consumption for the given operating speed of LSIs. Symposium on VLSI Circuits Digest of Technical Papers. pp. 99-100.

Su (1993) Experimental results and modeling techniques for substrate noise in mixed-signal integrated circuits. IEEE Journal of Solid-State Circuits. 28(4):420-430.

Vittal et al. (1996) Clock skew optimization for ground bounce control. University of California, Santa Barbara, CA, IEEE. pp. 395-399.

Vuillod et al. (1996) Clock-skew optimization for peak current reduction. Computer Systems Laboratory, Sanford University, ISLPED 1996 Monterey, CA. pp. 265-270.

Xu et al. (2001) Measuring and modeling the effects of substrate noise on the LNA for a CMOS GPS Receiver. IEEE Journal of Solid-State Circuits. 36(3):473-485.

* cited by examiner

METHOD AND APPARATUS FOR MINIMIZING THE INFLUENCE OF A DIGITAL SUB-CIRCUIT ON AT LEAST PARTIALLY DIGITAL CIRCUITS

CROSS REFERENCE TO RELATED APPLICATIONS

This application is a continuation of PCT Application No. PCT/BE05/000020, filed Feb. 14, 2005, which is incorporated by reference hereby in its entirety.

BACKGROUND

1. Field of the Invention

The invention relates to the field of design methodologies for electrical circuits, in particular digital circuits for use in mixed signal systems and thus comprising digital and analog parts, as well as circuits designed in accordance with the methodologies. More particularly, the invention relates to a method for minimizing the influence of a first digital sub-circuit on an at least partially digital circuit, the first digital sub-circuit being part of the at least partially digital circuit, to a second digital sub-circuit adapted for minimizing the influence of the first digital sub-circuit, to the at least partially digital circuit and to an at least partially digital circuit comprising such a second digital sub-circuit.

2. Description of the Related Technology

Digital switching noise that propagates through a chip substrate and/or through power/ground rails to an analog circuitry on a same chip is a major limitation for mixed-signal System-on-Chip (SoC) integration. In synchronous digital systems, digital circuits switch simultaneously on the clock edge, hereby generating a large ground bounce.

With the increase of switching speed of digital circuits and tighter signal-to-noise ratio specifications in analog circuits, ground bounce is a stopper for single-chip integration of mixed-signal systems ['D. K. Su, M. J. Loinaz, S. Masui, and B. A. Wooley, "Experimental results and modeling techniques for substrate noise in mixed-signal integrated circuits," IEEE J. Solid-State Circuits, Vol. 28, No. 4, pp. 420-430, 1993 and M. Xu, D. K. Su, D. K. Shaeffer, T. H. Lee' and 'B. A. Wooley, "Measuring and modeling the effects of substrate noise on the LNA for a CMOS GPS receiver," IEEE J. of Solid-State Circuits, Vol. 36, No. 3, pp. 473-485, 2001']. Even if for a mixed-signal application, the analog part is put on a separate die than the digital part, the data converters are usually put on the same chip as the digital part, where they are subject to noise coupling, which is mainly caused by ground bounce in the digital domain.

A technique called spread spectrum clock generation (SSCG) was introduced in 'K. B. Hardin, J. T. Fessler, and D. R. Bush, "Spread spectrum clock generation for the reduction of radiated emissions," in IEEE Proc. of the Int. Symp. on Electromagnetic Compatibility, pp. 227-231, August 1994' to reduce the spectral peaks of the digital clock as much as 10-20 dB by frequency modulation of the clock with a unique waveform. Through this modulation, the energy at each clock harmonic is distributed over a wider bandwidth. For the case of a 266 MHz clock with a triangular modulation and with a 2.5% frequency deviation, around 13 dB attenuation is measured with this technique [H.-H. Chang, I.-H. Hua, and S.-L. Liu, "A spread-spectrum clock generator with triangular modulation," IEEE J. Solid-State Circuits, Vol. 38, No. 4, April 2003].

Previous work has focused more on a single cell with a single-cycle input and ignored the impact of the system-level clocking on the ground bounce [T. Gabara, W. Fischer, J. Harrington, and W. W. Troutman, "Forming damped LRC parasitic circuits in simultaneously switched CMOS output buffers," IEEE J. Solid-State Circuits, Vol. 32, No. 3, pp. 407-418, 1997].

Introducing intended skews to the synchronous clock network in order to spread the simultaneous switching activities as such is known from 'M. Badaroglu, M. van Heijningen, V. Gravot, J. Compiet, S. Donnay, G. Gielen, and H. De Man, "Methodology and experimental verification for substrate noise reduction in CMOS mixed-signal ICs with synchronous digital circuits," IEEE J. Solid-State Circuits, Vol. 37, No. 11, pp. 1383-1395, November 2002'.

SUMMARY OF CERTAIN INVENTIVE ASPECTS

It is an object of certain inventive aspects to provide a digital sub-circuit, an at least partially digital circuit comprising such a digital sub-circuit and a design methodology for digital sub-circuits wherein the digital ground bounce is reduced by determining suitable system clock conditions, for instance determining a suitable phase/frequency modulation of the clock.

In one aspect this concept may be combined with a spatial clock skew or spatial variation in clock offset within an electronic circuit to obtain reduced noise effects. Spatial clock skew or spatial variation in clock offset may be achieved by organizing the electronic circuit in time zones, whereby each time zone has its own clock offset with respect to others. In a first inventive aspect, by modulating the phase/frequency of the offset clocks of the time zones, an improved control of noise can be obtained.

Accordingly, in accordance with an inventive aspect, a digital sub-circuit is provided suitable for embedding in an at least partially digital circuit for minimizing the influence of another digital sub-circuit on the at least partially digital circuit, the other digital sub-circuit being part of the at least partially digital circuit. The at least partially digital circuit furthermore comprises an internal or external system clock providing a clock signal to the at least partially digital circuit. The digital sub-circuit comprises a clock modulating circuit which comprises a phase/frequency modulating circuit for modulating the phase and/or frequency of the clock signal provided by the internal or external system clock before the clock signal is applied to at least part of the at least partially digital circuit. This modulated clock signal is an optimized clock signal minimizing the influence of the digital sub-circuit on the at least partially digital circuit.

With at least partially digital circuit is meant that, next to the digital sub-circuit the at least partially digital circuit may furthermore comprise as well digital as analog circuit parts.

In a further embodiment, the clock modulating circuit may furthermore comprise a clock spreading circuit for introducing intentional clock skews.

According to the first inventive aspect, a first part of the at least partially digital circuit may use a first clock signal, a second part of the at least partially digital circuit may use a second clock signal, the first and second clock signal being derived from the modulated clock signal and being shifted or varied over a predetermined time with respect to each other.

In an embodiment, the at least partially digital circuit may comprise an internal system clock, wherein the internal system clock comprises a clock pulse generator which is part of the clock modulating circuit. The clock pulse generator may be a triangular waveform generator, but may in other embodiments also a square wave generator or a pseudo random waveform generator.

According to certain embodiments, the phase/frequency modulating circuit may comprise:
- a feed-forward path for the clock signal to be phase/frequency modulated and a control signal, setting the amount of phase/frequency modulation, and
- a feedback path for the control signal, for realising the periodicity of the clock signal to be modulated.

The phase/frequency modulating circuit may be adapted for providing a dynamically changing phase/frequency.

In certain embodiments, the phase/frequency modulating circuit may comprise a multiplexer in the feedback path.

In other embodiments, the feed-forward path in the phase/frequency modulating circuit may comprise a plurality of delay elements with selectable delay values. The control signal may be used for selecting the delay values.

In a second inventive aspect, an at least partially digital circuit is provided, comprising a digital sub-circuit as described in the first inventive aspect. The at least partially digital circuit comprises:
- means for generating or inputting a system clock for providing a clock signal to the at least partially digital circuit, the clock signal having a phase and a frequency,
- a first digital sub-circuit being part of the at least partially digital circuit,
- a second digital sub-circuit being adapted for minimising the influence of the first digital sub-circuit on the at least partially digital circuit,
- wherein the second digital sub-circuit comprises a clock modulating circuit, the clock modulating circuit comprising a phase/frequency modulating circuit for modulating the phase and/or the frequency of the clock signal before the clock signal is applied to at least part of the at least partially digital circuit. This modulated clock signal is an optimised clock signal minimising the influence of the first digital sub-circuit on the at least partially digital circuit.

With at least partially digital circuit is meant that, next to the digital sub-circuit the at least partially digital circuit may furthermore comprise as well digital as analog parts.

In a further embodiment, the clock modulating circuit may furthermore comprise a clock spreading circuit for introducing intentional clock skews.

According to the first inventive aspect, a first part of the at least partially digital circuit may use a first clock signal, a second part of the at least partially digital circuit may use a second clock signal, the first and second clock signal being derived form the modulated clock signal and being shifted over a predetermined time with respect to each other.

In an embodiment, the at least partially digital circuit may comprise an internal system clock, wherein the internal system clock comprises a clock pulse generator which is part of the clock modulating circuit. The clock pulse generator may be a triangular waveform generator, but may in other embodiments also a square wave generator or a pseudo random waveform.

According to certain embodiments, the phase/frequency modulating circuit may comprise:
- a feed-forward path for the clock signal to be phase/frequency modulated and a control signal, setting the amount of phase/frequency modulation, and
- a feedback path for the control signal, for realising the periodicity of the clock signal to be modulated.

The phase/frequency modulating circuit may be adapted for providing a dynamically changing phase/frequency.

In some embodiments, the phase/frequency modulating circuit may comprise a multiplexer in the feedback path.

In other embodiments, the feed-forward path in the phase/frequency modulating circuit may comprise a plurality of delay elements with selectable delay values. The control signal may be used for selecting the delay values.

According to some embodiments, the at least partially digital circuit may be a multi-carrier telecom circuit, a signal processing circuit or a microprocessor.

In a third inventive aspect, a method for minimizing the influence of a first digital sub-circuit on an at least partially digital circuit is provided, the first digital sub-circuit being part of the at least partially digital circuit. The method comprises:
- determining optimal system-level clocking conditions for a clock signal to be applied to the at least partially digital circuit, in order to minimise the influence of the first digital sub-circuit to the at least partially digital circuit, and
- providing a second digital sub-system for adapting the clock signal according to the determined system-level clocking conditions before applying it to the at least partially digital circuit.

The method may be computer based, i.e. it is implemented as part of a design environment using a computer system such as a personal computer, a work station, a Local Area Network, a Wide Area network, etc.

With at least partially digital circuit is meant that, next to the digital sub-circuit the at least partially digital circuit may furthermore comprise as well digital as analog parts.

In one embodiment, the system-level clocking conditions may be parameters of a phase/frequency modulation of the clock signal to be applied to the at least partially digital circuit. In other words, the method according to this embodiment of the third inventive aspect has as a purpose to reduce the spectral peaks in the ground bounce spectrum, based on phase/frequency modulation of the clock. Experimental results show a significant reduction, e.g. greater than 6 dB, greater than 10 dB up to at least 26 dB reduction in the spectral peaks of the noise spectrum with either of these two techniques or when combined. These two techniques provide digital low-noise design techniques in CMOS technologies.

In other embodiments, phase/frequency modulation of the clock signal may be combined with introducing intended clock skews to spread the switching activities of the digital sub-circuit. The skews may be distributed spatially among parts of the circuits. Therefore, the first digital sub-circuit may be divided into at least two different parts and the system-level clocking conditions may furthermore comprise parameters for a skew or time shift to be applied to a phase/frequency modulated clock signal applied to a second part of the at least partially digital circuit with respect to a phase/frequency modulated clock signal applied to a first part of the at least partially digital circuit.

Note that spread spectrum clock generation (SSCG) technique introduced in 'K. B. Hardin, J. T. Fessler, and D. R. Bush, "Spread spectrum clock generation for the reduction of radiated emissions," in IEEE Proc. of the Int. Symp. on Electromagnetic Compatibility, pp. 227-231, August 1994' ignores the potential of clock modulation on reducing the ground bounce. The reduction is not limited to the clock signal only, which is a periodic signal, but it also applies to the supply current, which is not a periodic signal. This non-periodicity, together with the inherent wideband nature of the system supply current makes the analysis much more difficult on how much reduction can be achieved by the spread spectrum clocking.

The two methodologies, i.e. phase/frequency modulation and introducing intended clock skews, for minimizing the influence of a digital sub-circuit on an at least partially digital circuit, for example, ground bounce reduction, are illustrated by using the supply current as characterizing feature of the switching behavior, hence the reduction is based on the shaping of the supply current:

(1) phase/frequency modulation of the system clock in order to reduce the spectral peaks at the discrete harmonics, and
(2) introducing intended skews to the synchronous clock network in order to spread the simultaneous switching activities [M. Badaroglu, M. van Heijningen, V. Gravot, J. Compiet, S. Donnay, G. Gielen, and H. De Man, "Methodology and experimental verification for substrate noise reduction in CMOS mixed-signal ICs with synchronous digital circuits," IEEE J. Solid-State Circuits, Vol. 37, No. 11, pp. 1383-1395, November 2002].

It has, however, to be understood that inventive aspects described herein are not limited to shaping of the supply current. These inventive aspects may also be used for shaping the supply voltage and any signal within the circuit, which may be representative. By representative is meant that a suitable transfer function between such signal and the rest of the main part of the system can be identified. With main part of the system is meant that part contributing the most to the effect that we intend to minimize. With suitable transfer function is meant a non-zero relationship.

Ground bounce power is proportional to the integral of its spectrum, resulting from the multiplication of the supply current spectrum with its transfer function to the ground node. Since most of the noise power is concentrated around the frequency of the resonance of the package and supply line inductance with the circuit capacitance, reducing the power spectrum in the vicinity of this resonance will also reduce the ground noise [M. Badaroglu, M. van Heijningen, V. Gravot, J. Compiet, S. Donnay, G. Gielen, and H. De Man, "Methodology and experimental verification for substrate noise reduction in CMOS mixed-signal ICs synchronous digital circuits," IEEE J. Solid-State Circuits, Vol. 37, No. 11, pp. 1383-1395, November 2002].

With the methods, system-level clocking conditions are derived in order to achieve a desired level of reduction in the ground noise spectrum at the resonance by choosing the frequency and magnitude of the modulating waveform.

The results for a 40K-gates telecom circuit show a 16 dB reduction in the ground noise spectrum when these supply current shaping techniques are employed.

In summary, certain inventive aspects relate to a method for determining system-level clocking conditions to be used in the operation of an at least partially digital circuit, in order to achieve a minimization of the influence of a digital sub-circuit on an at least partially digital sub-circuit, for example, a reduction in the ground or substrate noise spectrum, to a digital sub-circuit for applying the determined system-level clocking conditions and at least partially digital circuits including the circuitry. With at least partially digital circuit is meant that, next to the digital sub-circuit the at least partially digital circuit may furthermore comprise as well digital as analog parts.

One inventive aspect relates to a method for determining system-level clocking conditions to be used in the operation of an at least partially digital circuit, in order to achieve a reduction in the ground or substrate noise spectrum.

In a first implementation the method includes a step of calculating the influence, for example substrate or ground noise by methods as described in EP application 01201000, or U.S. patent application Ser. No. 09/809,993.

For instance the step can be repeated for various system-level clocking conditions by an optimizer, selecting the optimal conditions. In principle, such method implies substrate or ground noise determination over various cycles for a representative input to the digital device. Note that various steps of the substrate or ground noise determining steps may be kept out of the optimization loop though by using a representative supply current.

To provide a speed-up of the method, a second implementation is disclosed, wherein first an average behavior of the digital device over the various cycles is determined (via statistical considerations), followed by a step of determining the system-level clocking conditions from the average single cycle behavior directly by an analytical formula. The second implementation avoids repetitive determination of substrate or ground noise. The step of determining an average behavior of the digital system involves a multi-cycle simulation, again exploiting part of the methods described in EP 01201000, U.S. patent application Ser. No. 09/809,993. Further the second implementation avoids the selection of a representative input signal.

It is clear that in general the use of a limited amount of cycles for the determining of the system-level clocking conditions from a larger set of cycles, the ratio of the amount of cycles for characterizing the average behavior and the amount of cycles used in the determining of the average is determined by on statistical considerations.

In an embodiment of the second implementation, the average behavior is characterized as a representative supply current (drawn by the digital device while switching).

In an embodiment of the second implementation the analytical formula inputs parameters of the transfer function from supply current to ground as determined by methods as described in EP application 01201000, U.S. patent application Ser. No. 09/809,993.

In a first embodiment the system-level clocking conditions are the parameters of a phase/frequency modulation of the system clock of the digital device.

The phase/frequency modulating circuit can use various modulation waveforms such as triangular or pseudo random, with a preference for triangular.

Among others, the parameters of such waveform can be the number of cycles for the modulating waveform to complete its one period, the maximal value of the phase/period (1/frequency) introduced in each clock cycle.

In another embodiment according to the third inventive aspect the system-level clocking conditions may additionally comprise the skew (time shift) to be applied to a phase/frequency modulated system clock, applied to a first region of the digital device, the skewed phase/frequency modulated system clock being applied to a second separate region of the digital device.

An implementation of the method including the second embodiment includes a step of assigning basic circuits within the digital device (transistors, gates and/or flip-flops) to regions.

Note that both the embodiments can be used in either of the two presented implementation of the methods.

Note that the further description focuses on the discrete harmonics of the system clock. It has to be noted that in a preferred embodiment the harmonic to be reduced is the circuit resonance frequency.

One inventive aspect relates to an electrical circuit, in particular a phase/frequency modulating circuit, with parameters determined in accordance with the invented methods.

In an embodiment the phase/frequency modulating circuit is part of an essentially digital device and the phase/frequency modulating circuit modulates the phase/frequency of the system clock, the phase/frequency modulated clock to be applied to at least at part of the essentially digital device.

In an embodiment in the essentially digital circuit, various parts or regions can be distinguished, in the sense that the circuitry (transistors, gates and/or flip-flops) within each of the parts or regions, uses a separate clock, the clocks are derived from the phase/frequency modulated clock (one of them may be the phase/frequency modulated clock itself) and skewed with respect to each other, meaning time shifted with respect to each other.

In an embodiment thereof hence the essentially digital device includes circuitry for time shifting clock signals.

In an embodiment thereof the circuitry for time shifting clock signals are part of a so-called synchronous clock network.

In an embodiment the digital circuit, including the phase/frequency modulating circuit, is part of a mixed signal type of circuit, hence including further an analog part, using the system clock.

Figure 1A:
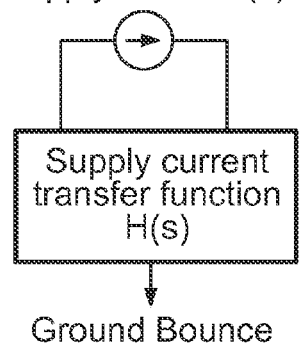
FIG. 1(a) shows a block level model of ground bounce generation and FIG. 1(b) is a chip-level ground bounce model.

In the different figures, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that embodiments described herein are capable of operation in other sequences than described or illustrated herein.

It is to be noticed that the term "comprising", used in the claims, should not be interpreted as being restricted to the elements listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to certain embodiments, the only relevant components of the device are A and B.

Certain embodiments provide a method for minimizing the influence of a first digital sub-circuit on an at least partially digital circuit, the digital sub-circuit being part of the at least partially digital circuit. Certain embodiments furthermore provide a second digital sub-circuit suitable for embedding in an at least partially digital circuit for minimizing the influence of a first digital sub-circuit to the at least partially digital circuit and an at least partially digital circuit comprising such a second digital sub-circuit. An example of the influence of the first digital sub-circuit on an at least partially digital circuit may be the generation of ground bounce. However, it has to be understood, although certain embodiments are mainly described by means of ground bounce reduction, that other influences related to signal integrity, such as for example substrate noise, electromagnetic coupling (EMC), radio frequency interference (RFI) may also be considered.

Figure 1B:
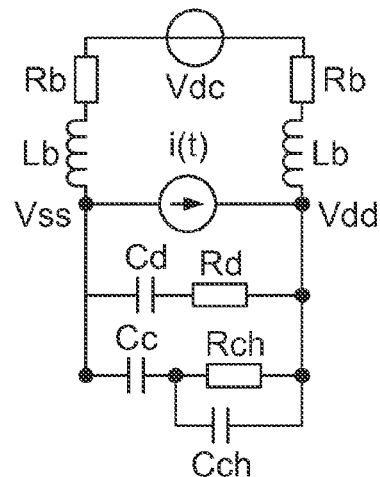

Ground bounce can be computed from the product of the spectrum of the supply current source with its transfer function to the ground node. This is illustrated in FIG. 1a which shows a block-level model of ground bounce generation. The transfer function is derived by using an extracted chip-level ground bounce model as illustrated in FIG. 1b [M. Badaroglu, M. van Heijningen, V. Gravot, J. Compiet, S. Donnay, G. Gielen, and H. De Man, "Methodology and experimental verification for substrate noise reduction in CMOS mixed-signal ICs with synchronous digital circuits," IEEE J. Solid-State Circuits, Vol. 37, No. 11, pp. 1383-1395, November 2002]. In this model, the impedance between Vdd and Vss is represented by a capacitance (Cc) in series with a resistance (Rch) in parallel with a capacitance (Cch). This Vdd-Vss impedance is determined by the junction, channel, well and overlap capacitances. The supply line inductance and its series resistance are respectively represented by Lb and Rb. Additional on-chip decoupling capacitance and its series damping resistance are respectively represented by Cd and Rd.

A designer has the following options to reduce the generated ground bounce, i.e.:
(1) Reducing the supply noise (i(t)) which may, for example, be done by flattening the supply current or reducing the supply voltage and
(2) Changing the transfer function of the supply current source to the ground node (H(s)), which may, for example, be done by increasing the decoupling to reduce the effect of switching capacitance, or by increasing the damping of the oscillations, or by decreasing the supply line inductance.

Figure 2A:
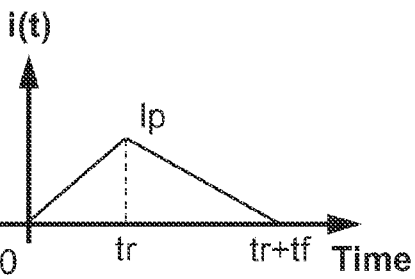
FIG. 2 shows a triangular approximation of the supply current in (a) time-domain (b) frequency domain.

For synchronous CMOS circuits, the total supply current in the time domain can be approximated by a periodic triangular waveform. To better understand the properties of this waveform, a single-cycle triangular waveform will first be studied (see FIG. 2a). In the next section, this will be extended to a multiple-cycle case.

The Fourier transform of a single-cycle waveform is in fact the envelope of the multiple-cycle waveform. The single-cycle waveform can be characterized by the peak current Ip, rise time tr and fall time tf. The supply current i(t) can be written as a function of the four ramp signals:

$$i(t) = Ip \cdot \begin{bmatrix} \frac{1}{tr} \cdot (r(t) - r(t - tr)) + \\ \frac{1}{tf} \cdot (r(t - tf - tr) - r(t - tr)) \end{bmatrix} \quad (1)$$

wherein r(t) is the unit ramp function.

The Fourier transform of the supply current i(t) is given by (FIG. 2b):

$$|I(j\omega)| = \left[\frac{2\sqrt{2} \cdot Q}{t_r \cdot t_f \cdot \omega^2}\right] \cdot \left[\sqrt{\frac{(t_f \cdot \sin(\omega \cdot t_r) - t_r \cdot \sin(\omega \cdot t_f))^2 +}{(t_f \cdot (1 - \cos(\omega \cdot t_r)) + t_r \cdot (1 - \cos(\omega \cdot t_f)))^2}}\right] \quad (2)$$

wherein Q is the total charge of the single-cycle waveform.

Figure 2B:
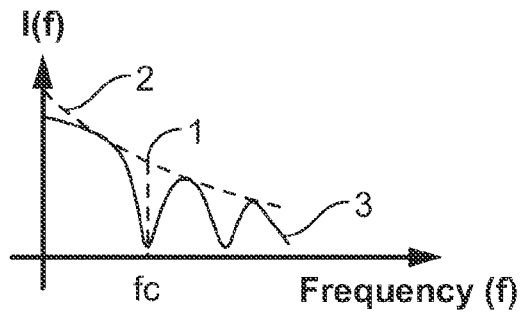

From FIG. 2b, which shows the triangular approximation of the supply current in the frequency domain, it can be seen that the spectrum shows a first local minimum at a frequency $f_c$. From eq. (2) it can be found that $f_c$ corresponds to the minimum of $1/t_r$ and $1/t_f$. Here, $f_c$ is the so-called corner frequency (indicated by reference number 1) of the supply current. In the spectrum of FIG. 2b two other terms are indicated, i.e. an envelope term indicated by reference number 2 and an oscillating term indicated by reference number 3.

In case $t_r = t_f$, the first local minimum can even be a notch (i.e. $I(\omega)=0$). In fact the notch points satisfy:

$$\frac{tr}{tf} = \frac{Nr}{Nf}, \quad (3)$$

$$N_r, N_f \in N$$

wherein Nr and Nf are the smallest natural numbers that satisfy the above relation.

The corner frequency fc of the supply current is given by:

$$f_c = \min\left(\frac{1}{t_r}, \frac{1}{t_f}\right) \quad (4)$$

The first notch frequency (fn) of the supply current is given by:

$$\text{for smallest } Nr, Nf \in N \Rightarrow fn = \frac{Nr}{tr} = \frac{Nf}{tf} \quad (5)$$

Other notch points occur at the integer multiples of the first notch frequency fn.

Figure 3:
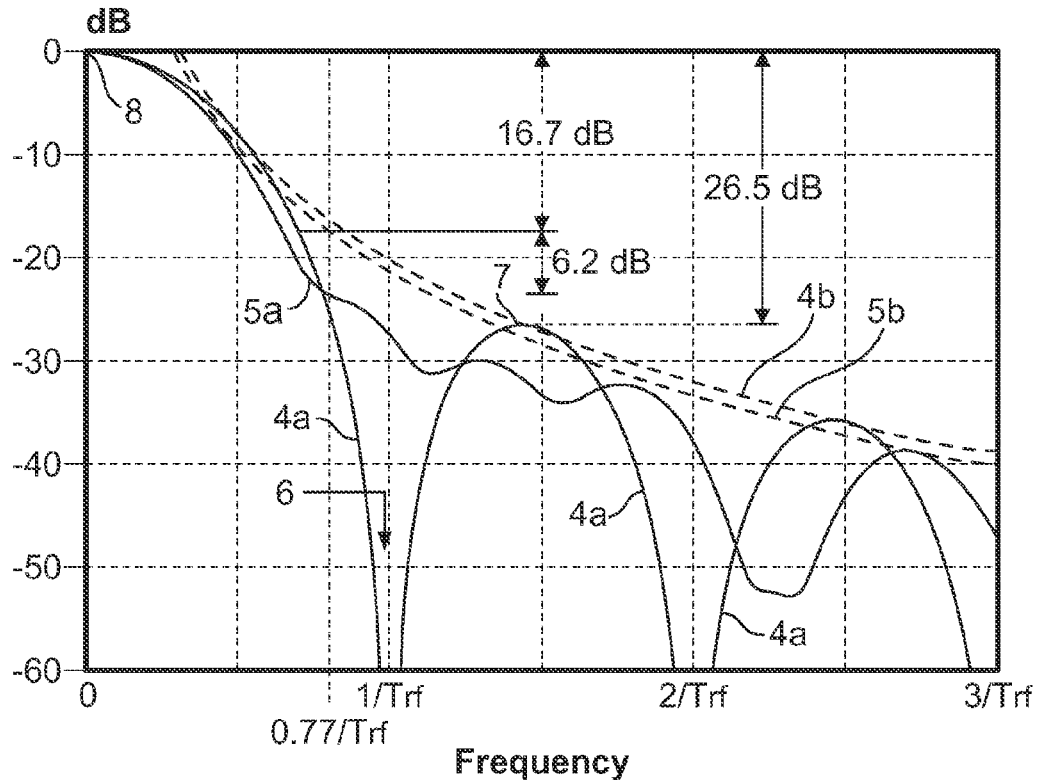
FIG. 3 illustrates the magnitude spectrum of the triangular supply current ($Q=I_p \cdot (t_r+t_f)/2$) wherein the magnitude of the supply current at the DC point has been normalized to 0 dB.

FIG. 3 shows the magnitude spectrum 4a and the envelope 4b for a triangular supply current waveform with tr and tf equal to $T_{rf}$. The waveform 4a has a notch point 6 at the frequency 1/Trf. Since the envelope 4b is given by 2√2·Q/($\omega^2$·Trf²), the second lobe 7 has a 26.5 dB smaller amplitude than the DC point 8. In this figure, the magnitude of the supply current at the DC point 8 has been normalized to 0 dB. While an incremental change in $t_r$ and/or $t_f$ can shift the notch point 6 to higher frequencies, a main lobe remains present. In addition to the attenuation due to the fact that the envelope is a decreasing function of frequency, at fc the "oscillating" term 3 provides an extra attenuation with a factor sin(α·π)/(1+α), with α equal to min(tr,tf)/max(tr,tf). As an example, for tr and tf equal to 0.9 $T_{rf}$ and 1.3 $T_{rf}$ respectively, $f_c$ becomes 0.77/$T_{rf}$ which is illustrated by curves 5a and 5b. At that point, the total attenuation of 22.9 dB consists of an envelope attenuation of 16.7 dB and an extra attenuation of 6.2 dB while the notch point (not shown) occurs at 10/$T_{rf}$ (eq. 5)).

The power spectrum of the supply current can be reduced by increasing $t_r$, $t_f$, and/or by decreasing Ip. Ip, $t_r$ and $t_f$ may also be referred to as the time-domain parameters. On the other hand, the power spectral density (PSD) can also be reduced by having larger $t_r$ ($t_f$) values in combination with having smaller tf (tr) values. The latter case should be judged by integrating the supply-current magnitude spectrum given by eq. (2).

Optimizing the time-domain parameters (Ip, $t_r$, and $t_f$) of the supply current may have a direct impact on its frequency-domain parameters (fc and fn) (see eq. (4) and (5)) with the following options:

(1) Shifting the notch frequency (fn) to the vicinity of the resonance frequency can significantly reduce the supply current PSD, therefore called ground bounce. However, the new notch frequency can be sensitive to changes in operating conditions, such as, for example, the temperature, the voltage and the process variations. The sensitivity to operating conditions may be reduced by guaranteeing that any change in operating conditions should change the tr and tf values in the same proportion such that the notch frequency does not change.

(2) In cases when stabilisation of the notch frequency is not realised (option 1), shifting the corner frequency (fc) well below the resonance frequency in order to reduce the ground bounce. In order to achieve this reduction insensitive to the changes in operating conditions, the corner frequency should be computed using the values of tr and tf obtained from the best-case operating condition such that the new corner frequency for the worst-case operating condition is already lower than the resonance frequency.

(3) It has to be noted that increasing the $t_r$ and $t_f$ values can become difficult for large inductances since in this case the ground bounce is dominated by the charge sharing between the switching circuit capacitance and the non-switching circuit capacitance. Therefore, reducing the number of switchings and/or increasing the decoupling still remain as reliable options in order to reduce the ground bounce.

Figure 4:
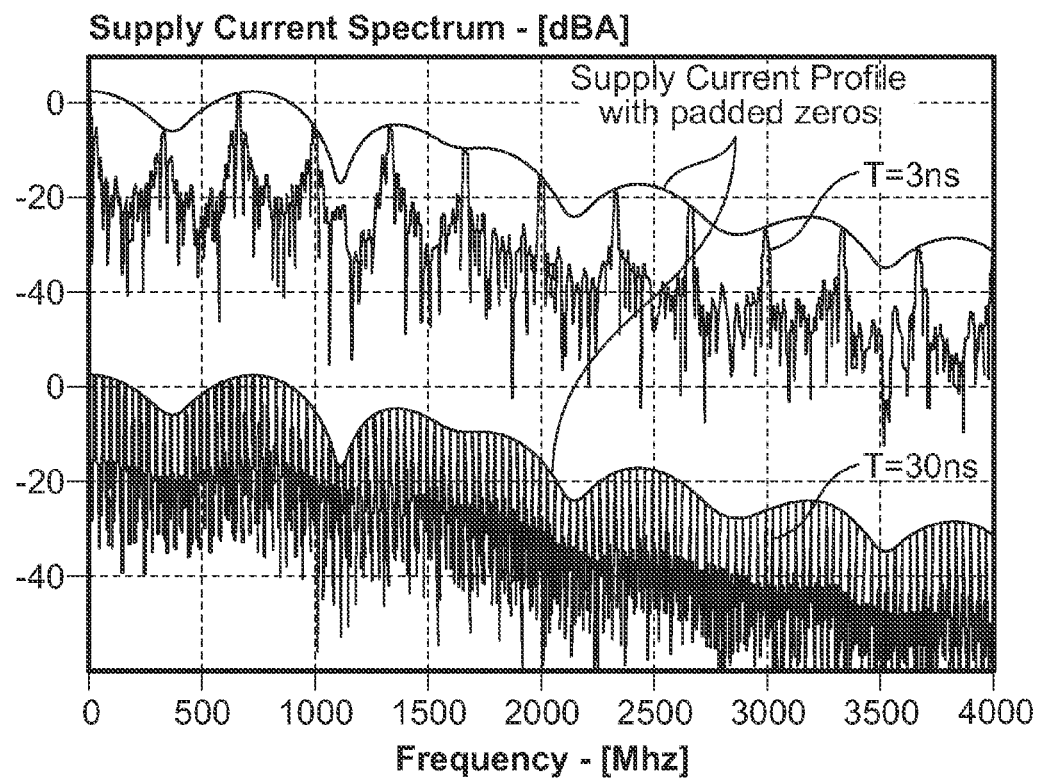
FIG. 4 shows the spectra of the total supply current and the ensemble averaged supply current of a 100 gates circuit for a period of 3 ns (top) and 30 ns (bottom).

The reduction of the supply current PSD can be done by introducing different skews to the branches of a clock tree driving a synchronous digital circuit. This skew is realized by splitting the design into several clock regions and introducing skews for each clock region and to finally implement a clock delay line, which generates a separate clock for every clock region [M. Badaroglu, M. van Heijningen, V. Gravot, J. Compiet, S. Donnay, G. Gielen, and H. De Man, "Methodology and experimental verification for substrate noise reduction in CMOS mixed-signal ICs with synchronous digital circuits," IEEE J. Solid-State Circuits, Vol. 37, No. 11, pp. 1383-1395, November 2002]. Although the supply current is not a purely periodic signal, the spectrum of the supply current closely resembles the spectrum that results from the periodic repetition of the single-cycle triangular waveform that has been computed as the average over all cycles. This spectrum will therefore further be referred to as the ensemble average of the supply current. Decreasing the operating frequency of the circuit will increase the number of harmonics and thus the number of envelope points visible. This is demonstrated in FIG. 4, which compares the spectrum of the ensemble average supply current to the spectrum of the actual SPICE-simulated supply current of a 100 gates circuit for periods of 3 ns (top) and 30 ns (bottom). FIG. 4 indicates that the spectrum of the ensemble average of the supply current matches that of the actual current transient at the clock harmonics.

The discrete spectrum is determined entirely by the average behavior of the digital switching current pulses in a synchronous digital system. The cycle-to-cycle variations of the supply current cause a (non-constant) noise floor to the spectrum, as seen in FIG. 4. The next section will explore by how much the energy of the discrete spectrum of the power supply current, that follows the spectrum of the ensemble average, exceeds the energy of this noise floor. The distance in dB between the discrete spectral lines and the noise floor around the spectral line under consideration will correspond to the maximum reduction of the energy in that spectral line by modulation of the clock.

The comparison of the RMS value of the ensemble average of the supply current ($\mu(t)$=iavg(t)) to the variations (n(t)) of the supply current around its average value will lead to the ratio $\eta$ between the total energy of the spectral peaks and the total energy of the noise floor [R. C. Frye, "Integration and electrical isolation in CMOS mixed-signal wireless chips," in Proc. of the IEEE, Vol. 89, No. 4, pp. 444-455, 2001]:

$$\eta = \sqrt{\frac{\int_0^\infty P_\mu(f)\cdot df}{\int_0^\infty P_n(f)\cdot df}} = \sqrt{\frac{R_\mu(0)}{C_{nn}(0)}} \quad (6)$$

wherein $P_n(f)$ and $P_\mu(f)$ are the power spectral densities (PSD) of the cross-covariance function and the ensemble average of the supply current respectively. The cross-covariance component arises from the cycle-to-cycle variations of the supply current. The average signal power of the ensemble average $R_\mu(0)$ may be computed by integrating the product of two identical triangular supply-current waveforms:

$$R_\mu(0) = \frac{1}{T_{clk}}\left[\int_0^{t_r}\left(\frac{I_p}{t_r}\right)^2 t^2 \cdot dt + \int_{t_r}^{t_r+t_f}\left(\frac{I_p}{t_f}\right)^2 (t-t_f)^2 \cdot dt\right] \quad (7)$$

$$= \frac{I_p^2 \cdot (t_r+t_f)}{3\cdot T_{clk}}$$

Figure 5:
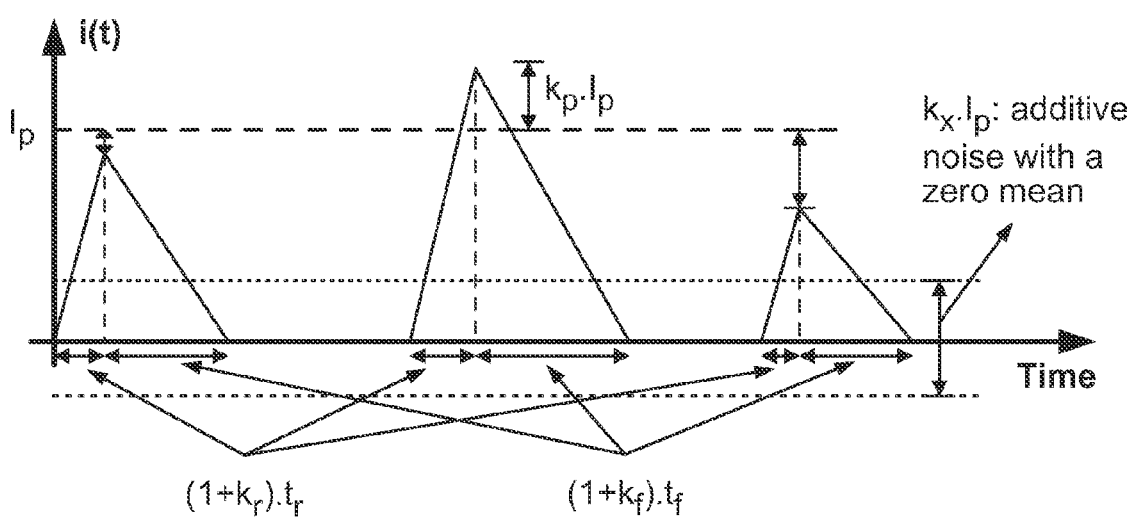
FIG. 5 illustrates the definition of the random variables for the cycle-to-cycle variations of the supply current.

Furthermore, kp, kr, and kf are defined as the maximum relative variations of the peak value, rise time, and fall time of the supply current, respectively, centered to their mean values, due to the cycle-to-cycle variations of the supply current. Additionally, additive noise on the supply current by a uniformly distributed noise with a zero mean and a variation kx·Ip are defined. These parameters are illustrated in FIG. 5. The auto-correlation of the ensemble average is a periodic pulse train consisting of the waveforms with the peak values given by the average power of a single cycle and with a pulse width equal to two times the pulse width of the supply current. For a uniformly distributed zero-mean additive variation on the average supply current, the average variation power is given by the second moment of the probability density function of the variation:

$$C_{nn}(0) = \int_{-k_x\cdot I_p}^{k_x\cdot I_p} x^2 \frac{1}{2\cdot k_x\cdot I_p}\cdot dx = \frac{k_x^2\cdot I_p^2}{3} \quad (8)$$

wherein kx·Ip is the maximum variation of the additive noise. In contrast, the parameter kp defines the percentage variation of the peak value of the supply current. In the case of additive noise (kx≠0), the variation can be nonzero at the times when $\mu(t)$=0. In the case of a variation in the peak value (kp≠0), this variation becomes zero at the times when $\mu(t)$=0. In the case of additive noise only, the comparison of the signal powers of the average supply current and the additive noise yields:

$$\eta = \frac{1}{k_x}\sqrt{\frac{t_r+t_f}{T_{clk}}} \quad (9)$$

In reality the supply current variation is not additive. A more realistic case occurs when the parameters $I_p$, $t_r$, and $t_f$ change randomly. In this case, the total signal power ($R_f(0)$) of the actual supply current is given by:

$$R_l(0) = \frac{1}{T_{clk}} \left[ \int_0^{t_r + \Delta t_r} \left( \frac{I_p + \Delta I_p}{t_r + \Delta t_r} \right)^2 t^2 \cdot dt + \right. \quad (10)$$

$$\left. \int_{t_r + \Delta t_r}^{t_f + t_f + \Delta t_r + \Delta t_f} \left( \frac{I_p + \Delta I_p}{t_f + \Delta t_f} \right)^2 (t - t_f - \Delta t_f)^2 \cdot dt \right]$$

When the parameters Ip, $t_r$, and $t_f$ change independently and with a uniform distribution then $\eta^2$ is given by:

$$\eta^2 = \frac{R_\mu(0)}{R_l(0) - R_\mu(0)} = \frac{1}{k_p^2/3 + k_{rf}^2/3 + k_p^2 \cdot k_{rf}^2/9} \quad (11)$$

Wherein $R_\mu(0)$ is given by eq. (7) and krf is defined as the percentage variation of the pulse width of the supply current, which is given by krf=(kr·tr+kf·tf)/(tr+tf).

Figure 6A:
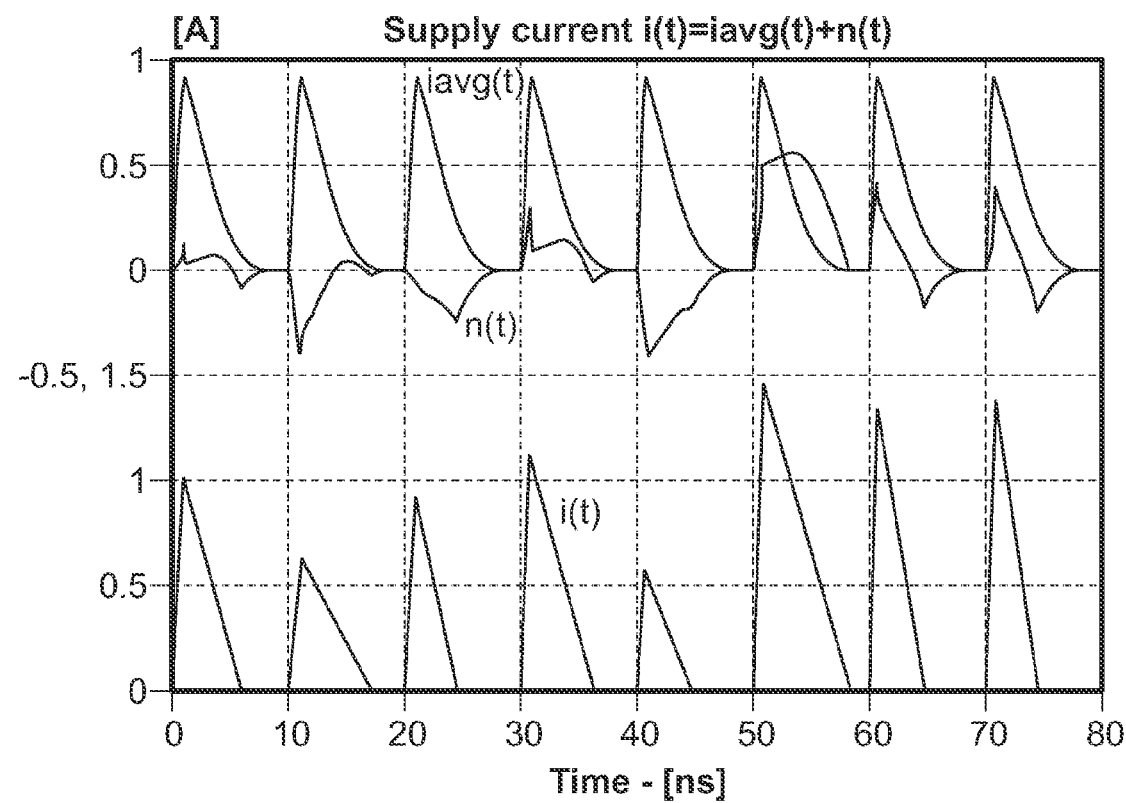
FIG. 6(a) shows the supply current waveform $i(t)=iavg(t)+n(t)$ when kp=0.5, kr=0.2, and kf=0.5
Figure 6B:
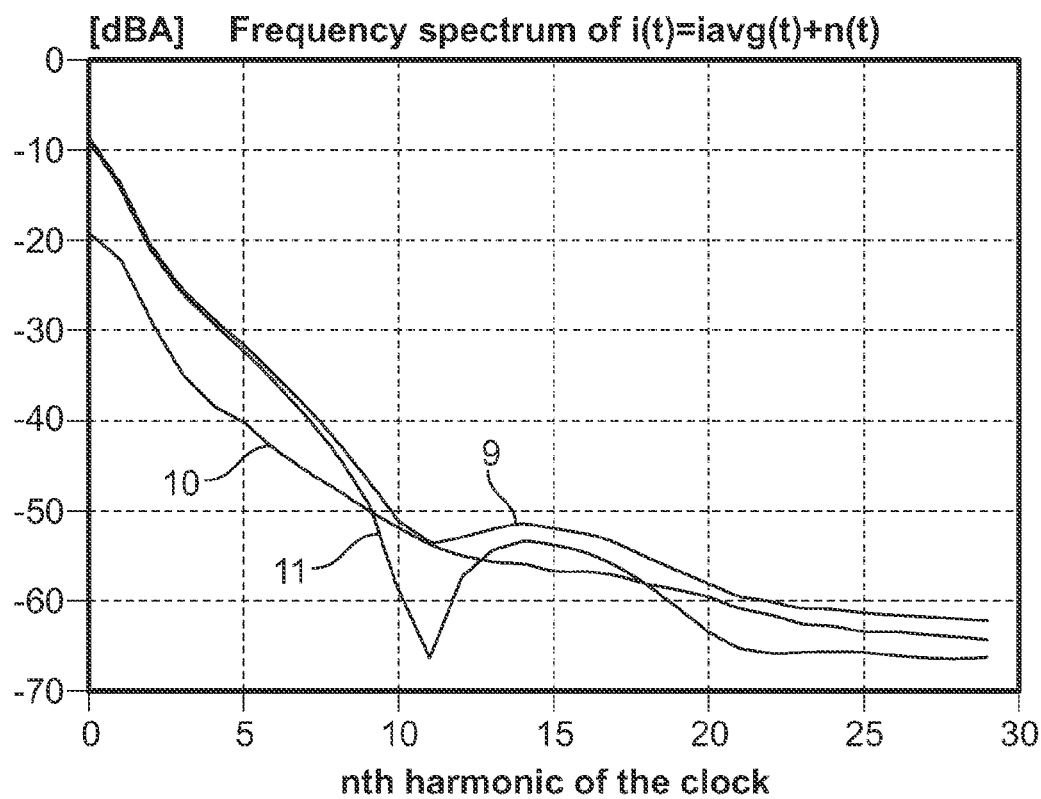
FIG. 6(b) shows the corresponding spectral power at each harmonic bin of the clock where $iavg(t)=\mu(t)$.

To illustrate the above analysis a fictitious current waveform is considered with 1A peak value, 1 ns rise time, 5 ns fall time and 10 ns clock period. The peak value (Ip), rise time ($t_r$), and fall time ($t_f$) of the supply current are changed uniformly with ±0.5 A, ±0.2 ns, and ±2.5 ns, respectively. This is illustrated in FIG. 6a which shows the supply current waveform i(t)=iavg(t)+n(t) when kp=0.5, kr=0.2 and kf=0.5. These variations are artificially large just for the sake of illustration and are not limiting this embodiment. The corresponding spectrum of the average supply current and its variation are shown in FIG. 6b. In FIG. 6b I(f), N(f) and Iavg(f) are respectively shown by curve 9, 10 and 11. η is computed as being equal to 8.15 dB after computing the total spectral power of iavg(t) and n(t) by using the simulation data while the estimation for η with eq. (11) is 8.06 dB. A variation in the rise/fall time makes the notches to disappear, but this is not relevant since these notches occur at higher frequencies where the power spectral density is already very low.

Any reduction technique that uses the periodicity of the average supply current has a margin of 2η (in dB) to reduce the power spectral density of the supply current. However, the energy of the supply current is also decreased due to the fact that this spectrum is multiplied by the transfer function from the supply current to the ground node, which has a bandpass characteristic. From this section, it can be concluded that, rather than using the actual supply current, it is sufficient to use the ensemble average supply current as a periodic pulse for the representation of the supply current with an error bound η (eq. (11)).

By using the model of FIG. 1b the voltage swing at the Vss node is computed with the supply current as the input after converting the network to an equivalent parallel RLC-network. The capacitance (CP) and inductance (LP) of this parallel RLC-network are given by:

$$CP = \frac{Cch \cdot (Cc + Cch) \cdot Cc}{1 + \omega^2 \cdot Rch^2 \cdot} + \frac{Cd}{(1 + \omega^2 R d^2 C d^2)} \quad (12)$$

$$LP = \frac{2 \cdot (Rb^2 + \omega^2 \cdot Lb^2)}{\omega^2 \cdot Lb}$$

The resonance frequency (fo) is given by:

$$f_o = \frac{1}{2\pi \cdot \sqrt{LP \cdot CP}} \quad (13)$$

In order to solve eq. (12), an iterative approach can be employed by first finding an initial value of fo for LP=2·Lb and CP=Cc+Cd. This fo is then used in order to update the new values of LP and CP.

Table 1 lists the extracted ground bounce macromodel parameters for ITC'99 benchmark circuits [ITC99 benchmark circuits: http://www.cad.polito.it/tools/itc99.html] with and without the local interconnect effects (interconnect only within the gate and no signaling interconnect between the gates). The accuracy of the ground bounce macromodel parameters has been verified with measurements [M. Badaroglu, L. Balasubramanian, K. Tiri, V, Gravot, P. Wambacq, G, Van der Plas, S. Donnay, G. Gielen, and H. De Man, "Digital circuit capacitance and switching analysis for ground bounce in ICs with a high-ohmic substrate," in Proc. of European Solid-State Conf., pp. 257-260, September 2003]. The data show that ignoring the interconnect overestimates the resonance frequency with about 5-6%. This overestimation increases up to 15% when the signaling between the gates is also taken into account [M. Badaroglu, L. Balasubramanian, K. Tiri, V, Gravot, P. Wambacq, G, Van der Plas, S. Donnay, G. Gielen, and H. De Man, "Digital circuit capacitance and switching analysis for ground bounce in ICs with a high-ohmic substrate," in Proc. of European Solid-State Conf., pp. 257-260, September 2003]. An accurate estimation of the resonance is important for the efficient implementation of the phase modulation of the system clock as well as of the intended clock skews.

TABLE 1

Ground bounce macromodel parameters without/with the loca interconnect effects for ITC'99 benchmark circuits (leftmost column) synthesized in a 0.18 µm CMOS process.

|     | Cc [fF]         | Rch [Ω]           | Cch [fF]        | Area [NAND2] |
| --- | --------------- | ----------------- | --------------- | ------------ |
| B01 | 912-1041        | 6.1038-5.5070     | 349-512         | 110          |
| B02 | 846-961         | 11.649-10.612     | 239-369         | 95           |
| B03 | 5261-6008       | 2.1309-1.9485     | 1455-2306       | 604          |
| B04 | 15754-17911     | 0.74069-0.67836   | 4459-6947       | 1776         |
| B05 | 11431-13000     | 0.47179-0.42399   | 4782-6909       | 1319         |
| B17 | 279565-320435   | 0.01732-0.01554   | 132949-190750   | 39782        |
| B18 | 748855-862358   | 0.00679-0.00610   | 360566-523212   | 102326       |

TABLE 1-continued

Ground bounce macromodel parameters without/with the loca interconnect effects for ITC'99 benchmark circuits (leftmost column) synthesized in a 0.18 μm CMOS process.

|     | Cc [fF]         | Rch [Ω]          | Cch [fF]       | Area [NAND2] |
| --- | --------------- | ---------------- | -------------- | ------------ |
| B20 | 144732-167026   | 0.03940-0.03548  | 69357-102309   | 18638        |
| B21 | 71784-82895     | 0.07980-0.07185  | 34653-51225    | 9366         |
| B22 | 134384-155622   | 0.04065-0.03659  | 67923-100129   | 17839        |

Phase modulation of the clock will reduce the harmonics in the discrete spectrum by creating sidelobes around the clock harmonics. This will decrease the energy of the discrete spectrum, which is the dominant component of the supply current. In the time domain, this leads to a supply current with a different phase at each cycle. This supply current i(k) is monitored (k represents the discrete time) over a time interval of R clock cycles, and each cycle consists of K time samples:

$$i(k) = \sum_{r=0}^{R-1} i_r(k - r \cdot K - d(r)) \quad (14)$$

wherein the current pulse $i_r(k)$ in each period is a stochastic variable and each clock cycle r is a trial whose outcome is $i_r(k)$. Furthermore, $i_r(k)$ is zero outside the interval 0<k<K. The parameter r selects a clock cycle (r: 0→R−1) and d(r) is the phase introduced in clock cycle r. The discrete-time Fourier transform (DFT) of this supply current is given by:

$$I(l) = \sum_{k=0}^{K-1}\sum_{r=0}^{R-1} i_r(k - r \cdot K - d(r)) \cdot e^{-j \cdot (2\pi/K/R) \cdot k \cdot l} \quad (15)$$

After expanding the DFT of eq. (15) for each cycle r, the DFT at point l=p.R, i.e. at the p-th harmonic of the system clock, for the single cycle is given by:

$$I(l = p \cdot R) = I_r(p) \cdot W(p) \quad (16)$$

$$W(p) = \left[ \begin{array}{c} e^{j \cdot (2\pi/K) \cdot d(0) \cdot p} + e^{j \cdot (2\pi/K) \cdot d(1) \cdot p} + \ldots + \\ e^{j \cdot (2\pi/K) \cdot d(R-1) \cdot p} \end{array} \right] / R$$

wherein $I_r(P)$ is the DFT of the single cycle when the supply current is periodic with K data points, i.e. $i_r(k-r \cdot K)=ir(k)$ at each clock cycle r. In the case when d(r) is zero for all R values, the DFT of the supply current is equal to the DFT of a single cycle. d(r) can be chosen as either a cyclic pseudo random sequence or a periodic triangular waveform. In order to achieve a significant reduction at the p-th harmonic, the amplitude of the variation in the time-domain should be chosen as:

$$\max(d(r)) = K/p \quad (17)$$

With this choice on the amplitude of the variation W(p) always evaluates to zero for both triangular and pseudo random waveforms. For a significant reduction, p is chosen as the harmonic at the circuit resonance fo given by eq. (13). Eq. (17) then becomes:

$$\max(d(r)) = \frac{K}{f_o \cdot Tclk} \quad (18)$$

wherein Tclk is the clock period.

Figure 7:
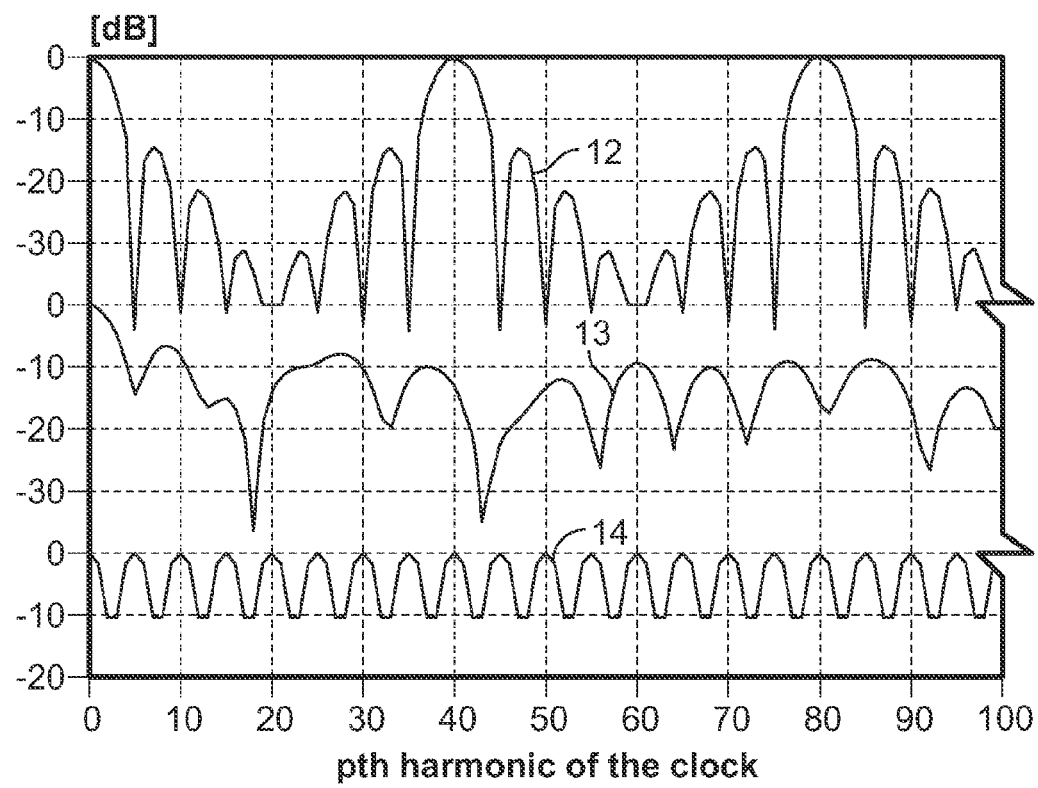
FIG. 7 shows a frequency spectrum of the different modulating waveforms i.e. triangular, pseudo random and square.

FIG. 7 shows the frequency spectrum of the different modulating waveforms: triangular (curve 12), pseudo random (curve 13) and square (curve 14) for m=16 and max(d (r))=0.2. It can clearly be seen in FIG. 7 that a triangular modulating waveform (curve 12) is among the best if the supply current bandwidth is limited to the first 20 harmonics of the clock. At the fifth harmonic W(p) evaluates to zero as also given by eq. (16). The reduction at the discrete clock harmonic will be significant if the resonance is centered at the fifth harmonic of the system clock. On the other hand, this reduced energy at this harmonic is spread onto the sideband harmonics. Other modulation profiles exist, which give more suppression in these sideband harmonics, such as the non-linear SSCG waveform (Hershey Kiss Profile) [K. B. Hardin, J. T. Fessler, and D. R. Bush, "Spread spectrum clock generation for the reduction of radiated emissions," in IEEE Proc. of the Int. Symp. on Electromagnetic Compatibility, pp. 227-231, August 1994]. However, this profile suffers from its hardware implementation.

An important constraint for a digital system is to have a small cycle-to-cycle jitter in order to avoid setup time violations. The periodic triangular waveform has shown to be the best choice to have a minimum jitter. In this case, the cycle-to-cycle jitter Δkc is limited to:

$$\Delta kc = \frac{2 \cdot K}{p \cdot m} \quad (19)$$

Wherein m determines the periodicity of the function W(p) in the frequency domain as given by eq. (16). A minimum value of m should be chosen such that the bandwidth of the supply current, BW(Ir(p)), is less than the spectrum periodic frequency of the modulating waveform W(p). Hence:

$$m > \frac{4 \cdot Tclk \cdot BW(Ir(p))}{p} \quad (20)$$

The bandwidth of the supply current is defined by max(1/tr,1/tf) where the supply current has a notch in the case when tr and tf are integer multiples of each other. On the other hand, m should not be chosen too large since this will result into a too small unit delay Δkc (eq. (19)), which cannot be realized in practice. Phase modulation of the clock can be constructed easily with a multiplexer choosing the multiphase outputs of the clock source.

Figure 8:
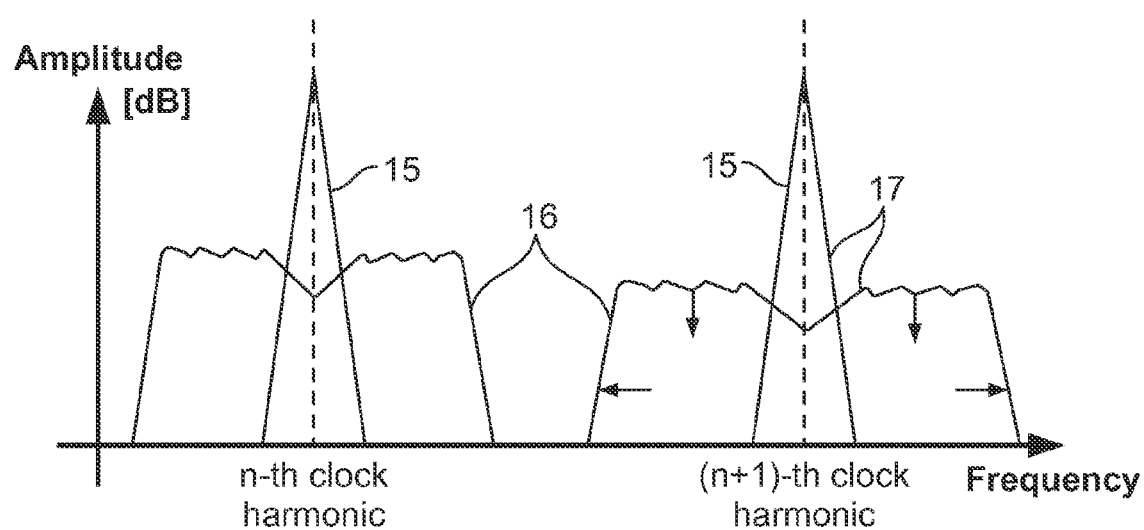
FIG. 8 is a frequency-domain representation of the effect of clock frequency modulation on a discrete tone of the supply-current spectrum at a clock harmonic.

As an alternative to phase modulation of the clock, frequency modulation of the clock will also reduce the harmonics in the discrete part of the supply current PSD by creating side lobes around the clock harmonics without any change in the total spectral power, as shown in FIG. 8. FIG. 8 is a frequency-domain representation of the effect of clock frequency modulation on a discrete tone of the supply current at a clock harmonic. Reference numbers 15 and 16 indicate the situation before respectively after frequency modulation. Reference number 17 illustrates that there is no change in spectral power.

In fact, frequency modulation of the clock will bring more reduction in spectral peaks with respect to phase modulation. In the time domain, this frequency modulation leads to a supply current with a different clock period (frequency) at each cycle. The supply current i(t) is monitored over a time interval of R clock cycles. The period of each cycle is $T_{clk}+d(r)$ where $d(r)$ is the additional period introduced in the clock cycle r. The supply current with frequency (period) modulation is given by:

$$i(t) = \sum_{r=0}^{R-1} i_r\left(t - \sum_{j=0}^{j=r-1} (T_{clk} + d(j))\right) \quad (21)$$

The clock-modulating waveform $d(r)$ can be chosen as a cyclic pseudo-random waveform, a square waveform or a periodic triangular waveform. By taking into account the cycle-to-cycle jitter, the hardware cost and the side lobe spreading efficiency (flatter side lobes), the triangular waveform as the clock-modulating waveform becomes the best choice among these alternatives [K. B. Hardin, J. T. Fessler, and D. R. Bush, "Spread spectrum clock generation for the reduction of radiated emissions," in IEEE Proc. of the Int. Symp. on Electromagnetic Compatibility, pp. 227-231, August 1994].

The modulating frequency $f_m$ of the clock-modulating waveform $d(r)$ can be defined as:

$$f_m = \frac{F_{clk}}{m_{cycle}} \quad (22)$$

wherein $F_{clk}$ is the clock frequency and $m_{cycle}$ is the number of clock cycles which the clock-modulating waveform completes its one period. The total amount (peak-to-peak) of frequency spreading $\Delta F$ as a relative percentage of the master clock frequency $F_{clk}$, which is expressed by $\alpha$, can be defined as:

$$\alpha = \frac{\Delta F}{F_{clk}} \quad (23)$$
$$= \frac{1/T_{clk} - 1/[T_{clk} + \max(d(r))]}{1/T_{clk}}$$
$$= \frac{\max(d(r))}{T_{clk} + \max(d(r))}$$
$$= \frac{\gamma}{1+\gamma}$$

wherein $\gamma$ is the total amount of clock period spreading as a relative percentage of the master clock period $T_{clk}$. The ratio between the peak ($\Delta F/2$) of the frequency spreading and the modulating frequency leads to the frequency modulation index $\beta$. The frequency spreading $\Delta F$ grows by higher harmonics of the clock. The modulation index $\beta$ at the p-th harmonic is given by:

$$\beta = \frac{\Delta F}{2f_m} \quad (24)$$

where $$\Delta F = p \cdot \alpha \cdot F_{clk}$$

The larger the $\beta$ value is, the more evenly distributed the spectrum of the side lobe harmonics around the spectral peak is. For, for example, a 50 MHz clock with a 5% frequency spread, having a value for $\beta$ of about 10, corresponds to a modulating frequency of 125 kHz to achieve an even distribution of the side lobe harmonics at the fundamental clock frequency. The modulated signal is contained inside the bandwidth $p \cdot \alpha \cdot F_{clk}$ for $\beta \gg 1$ at the p-th clock harmonic. The side lobe harmonics of different clock harmonics start to overlap at higher harmonics of the clock. In the case of non-overlapping side lobes, the attenuation of the spectral peak at the clock harmonic after clock frequency modulation is given by:

$$A_{dB}(p) = 20 \cdot \log_{10}(2\beta) \quad (25)$$

The above formula states that the modulation index $\beta$ needs to be increased for more attenuation. On the other hand, there are conditions that limit the modulation index. This will be described shortly hereinafter.

In order to reduce the discrete part of the supply current PSD, the spreading of the spectral peak at the clock harmonic(s) located in the vicinity of the circuit resonance frequency needs to be maximized. The bandwidth of the spreading spectrum is chosen as $q_m \cdot F_{clk}$ in the vicinity of the resonance frequency. Here, the term $q_m$ ($\leq 1$) refers to the spectrum utilization percentage, i.e. the proportion of the frequency spectrum between two adjacent harmonics that is used for spreading. The number of clock harmonics $p_{res}$ that is situated around the circuit resonance frequency $f_o$ may be defined by:

$$p_{res} = \frac{f_o}{F_{clk}} \quad (26)$$

In order to have a spreading bandwidth of $q_m \cdot F_{clk}$ in the vicinity of the circuit resonance frequency, the value of $\alpha$ is given by:

$$\alpha = \frac{\gamma}{1+\gamma} = \frac{q_m}{p_{res}} \quad (27)$$

The value of $q_m$ is limited by the following constraints:
(1) timing constraints that limit the value of $\gamma$,
(2) the bandwidth requirements of an intermediate RF frequency band placed between two harmonics, and
(3) avoiding unwanted spectral peaks due to overlapping side lobes at higher harmonics of the clock above the resonance frequency.

For the latter constraint the value of $q_m$ is set by taking into account the spectrum bandwidth of the resonance such that the spectral peaks outside this bandwidth should contribute less to the noise. The side lobes of the remaining higher clock harmonics can be allowed to overlap due to the fact that the spectral peaks start to attenuate with increasing frequencies since the supply current has a low-pass spectrum.

After setting the value of $q_m$, the modulation index $\beta$ is maximized by decreasing the modulation frequency as much as possible. Eq. (24) then becomes:

$$\beta = \frac{q_m \cdot F_{clk}}{f_m} = \frac{q_m \cdot m_{cycle}}{2} \quad (28)$$

Figure 9:
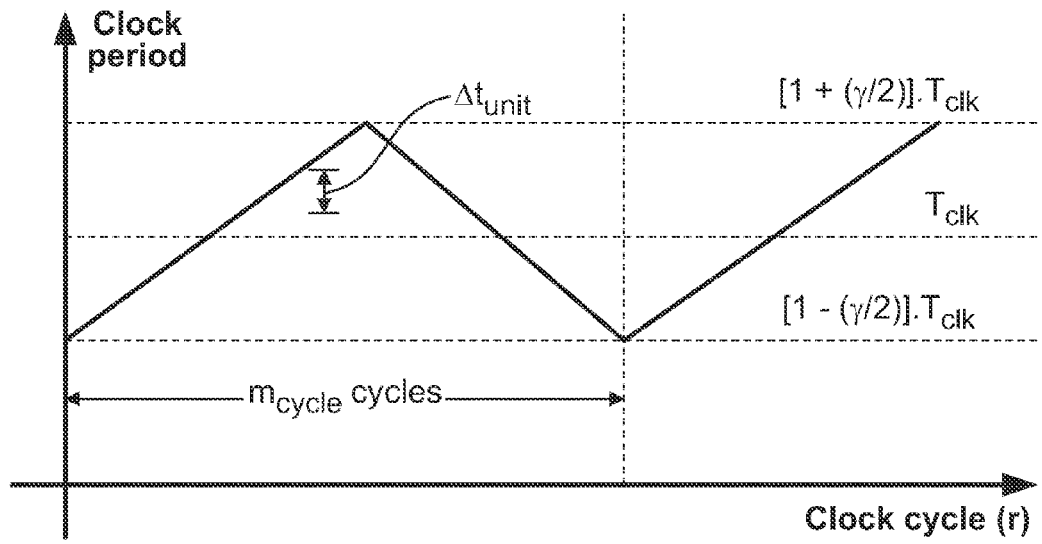
FIG. 9 is the frequency modulation of the clock by means of a triangular clock-modulating waveform.

On the other hand, the minimum achievable value for the modulation frequency ($f_m$) is constrained by the resolution of the circuit that generates the triangular clock-modulating waveform. Such a resolution figure can be modeled by a unit time step ($\Delta t_{unit}$) used for the construction of the triangular clock modulating waveform in $m_{cycle}$ clock cycles (see FIG. 9). The parameter $\Delta t_{unit}$ can, for example, be the clock uncertainty coming from the clock interconnect, the clock jitter, process variations and operating conditions. From FIG. 9 it can be found that the unit time step $\Delta t_{unit}$ may be given by:

$$\Delta t_{unit} = \frac{2\gamma \cdot T_{clk}}{m_{cycle}} \quad (29)$$

By combining eq. (28) and eq. (29), an expression for the modulation index $\beta$ is found to be:

$$\beta = \frac{q_m \cdot \gamma \cdot T_{clk}}{\Delta t_{unit}} \quad (30)$$

The parameters for a triangular clock-modulating waveform are summarized in Table 2 herebelow. In this embodiment, the parameters $q_m$ and $\Delta t_{unit}$ are chosen as independent parameters. The other parameters are computed accordingly.

TABLE 2

The parameters of a triangular clock-modulating waveform.

| | Description |
|---|---|
| $\gamma$ | Total amount of time spreading as a relative percentage of the master clock period |
| $\alpha$ | Total amount of frequency spreading as a relative percentage of the master clock frequency |
| $q_m$ | Spectrum utilization factor indicating the proportion of the spectrum that is allocated for spreading the side lobes in the vicinity of the resonance frequency |
| $\beta$ | Frequency modulation index |
| $m_{cycle}$ | Number of clock cycles, which the clock-modulating waveform completes its one period |
| $\Delta t_{unit}$ | Unit time step used for the construction of the triangular clock-modulating waveform |

The above proposed methodology will be illustrated hereinafter by means of two examples: two maximum-length 10-bit Pseudo-Random-Binary-Sequencers (PRBS) with a correlator, and a large telecom circuit (40K-gates), both implemented in a 0.18 μm 1.8V CMOS process.

Figure 10:
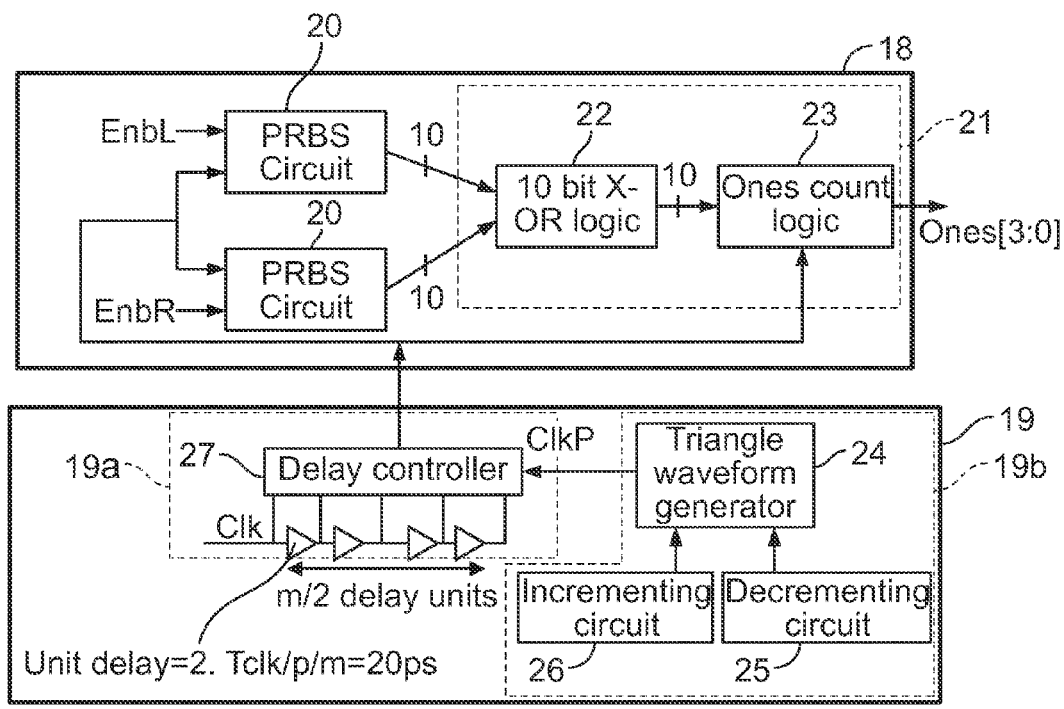
FIG. 10 illustrates a pseudo-random-binary-sequencer (PRBS) circuit with the correlator and the clock modulating circuit.

FIG. 10 illustrates an example of a test circuit 18 that is controlled by a clock modulating circuit 19 according to one embodiment. The test circuit 18 according to this example may comprise two PRBS circuits 20 and a correlator 21, the correlator 21 comprising 10-bit X-OR logic 22 and ones count logic 23. The clock modulating circuit 19 according to the example given in FIG. 10, may comprise a clock spreading circuit 19a and a clock pulse generator 19b. It has, however, to be understood that the clock pulse generator 19b may also be positioned external of the clock modulating circuit 19, and even external to the complete circuit. The clock pulse generator 19b may, according to the example given in FIG. 10, comprise a triangle waveform generator 24, a decrementing circuit 25, an incrementing circuit 26. The clock spreading circuit 19a may comprise a delay controller 27. The macromodel element values and parameters of the clock modulating circuit 19 of the example given in FIG. 10 are summarized in Table 3.

TABLE 3

Macromodel element values and parameters of the clock generator circuit according to FIG. 10.

| Macromodel element values parameters | Parameters of the clock generator(phase modulator) circuit |
|---|---|
| Lb = 1 nH | Tclk = 10 ns |
| Rb = 0.1 Ω | M = 100 |
| Cc = 9.55 pF | p = 5 |
| Rch = 3.11 Ω | |
| Cch = 2.93 pF | |

Figure 11:
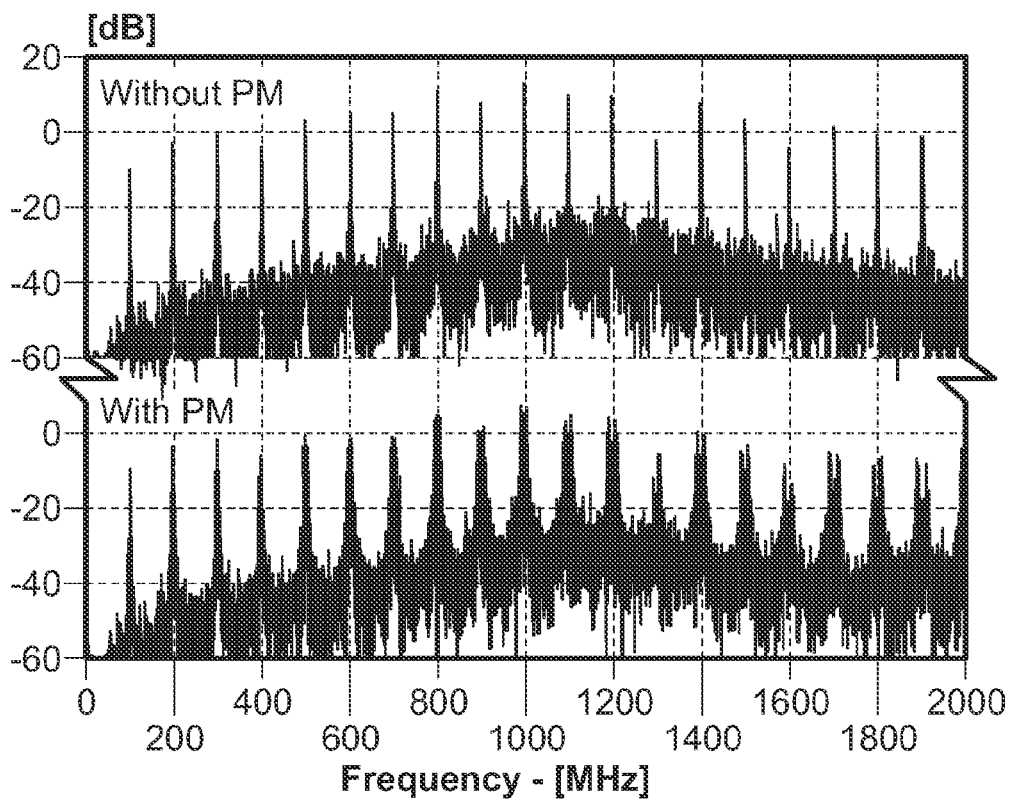
FIG. 11 shows spectra of ground bounce with and without clock phase modulation for the PRBS's with correlator as illustrated in FIG. 10 and with Fclk=100 MHz).

The design as illustrated in FIG. 10 may have, for example, a 100 MHz clock and supply line parasitics of 1 nH+0.1Ω. The supply current transfer function to the ground node may have a resonance frequency at 1.15 GHz. An ensemble averaged supply current profile has been constructed using the actual supply current data of 1000 clock cycles, which was obtained from SPICE simulations, which is a popular program for simulation of VLSI circuits. Choosing, for example, 1000 clock cycles and considering the intrinsic periodicity of the 10-bit PRBS, results in an unbiased estimate. The multiplication of the spectrum of the ensemble averaged supply current with the transfer function to the digital Vss node gives a maximum peaking at 1 GHz. Therefore, the 10th harmonic (p=10) is chosen as the notch of the modulating waveform. As a result of this notch, the harmonic at 1 GHz is completely attenuated. The largest sideband harmonic around 1 GHz after phase modulation is 8 dB below with respect to the harmonic at 1 GHz before the phase simulation (see FIG. 11). FIG. 11 shows spectra of ground bounce with (bottom curve) and without (top curve) clock phase modulation.

Figure 12A:
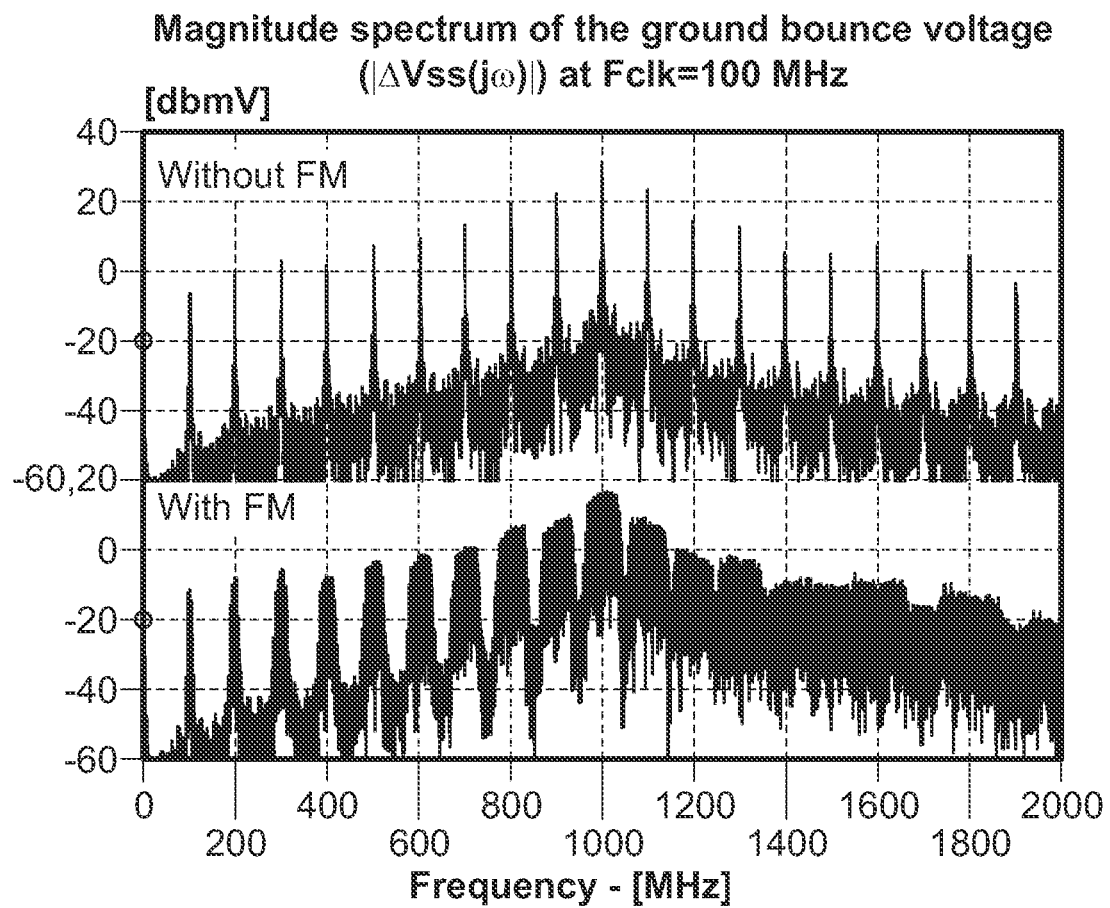
FIG. 12(a) shows spectra of the ground bounce voltage with and without clock frequency modulation (FM) for the circuit with two PRBS blocks and with correlator (Fclk=100 MHz) with $q_m$=0.7.
Figure 12B:
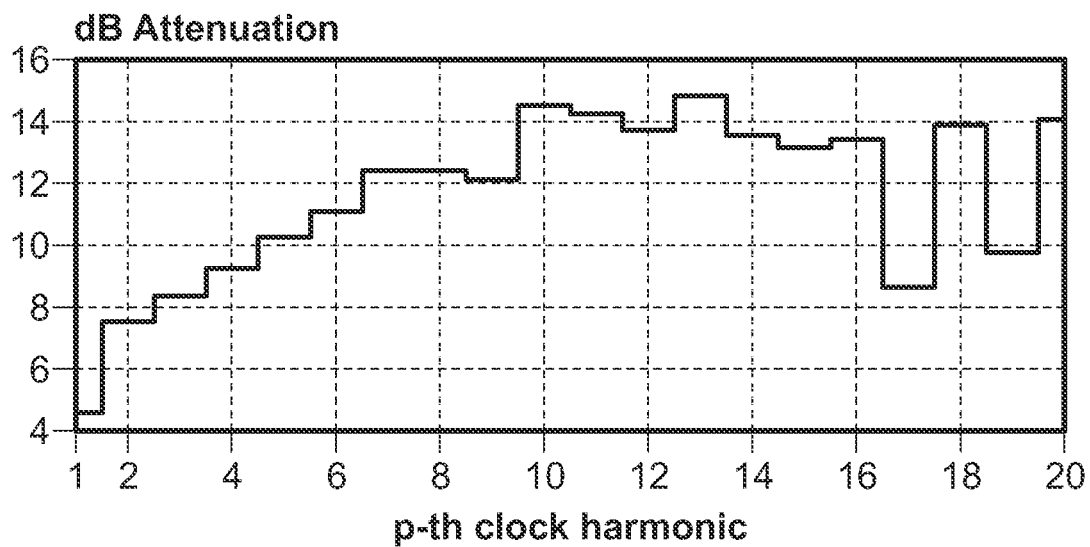
FIG. 12(b) shows the corresponding reduction in dB in the spectral peaks from the first to the 19$^{th}$ clock harmonic.

The impact of the clock frequency modulation on the spectrum of the ground bounce voltage will now be illustrated using the same circuit as shown in FIG. 10, which contains the two PRBS modules 20 and the correlator 22, 23. The 10$^{th}$ harmonic ($p_{res}$=10) is chosen in order to spread the spectral peak at this harmonic to the side lobes. The overlapping side lobes at higher clock harmonics can create unwanted spectral peaks inside the side lobe. For this reason a spectrum utilization of 70% was chosen for the 10$^{th}$ clock harmonic (this is where the circuit resonance is located). To utilize the spreading for 70% of the spectrum ($q_m$=0.70) in the vicinity of the resonance frequency, $\alpha$ is computed to be 0.07 ($\gamma$=0.0753) using eq. (27). This guarantees non-overlapping side lobes for the next four harmonics above the 10$^{th}$ harmonic. For the harmonics higher than the 14$^{th}$ harmonic, the side lobes of these harmonics start to overlap. On the other hand, their noise contribution is not significant. By choosing a unit time step ($\Delta t_{unit}$) of 20 ps, $\beta$ is computed to be 5.25 using eq. (30). This value is reasonably large for even spreading of the side lobe harmonics. With these parameters, the frequency of the clock-modulating waveform becomes 133 KHz ($m_{cycle}$=75). After the clock frequency modulation the largest side lobe harmonic around 1 GHz is 14.5 dB lower than the harmonic at 1 GHz before the clock frequency modulation. FIG. 12a shows spectra of the ground bounce voltage with (bottom curve) and without (top curve) clock frequency modulation. The attenuations at other harmonics are shown in FIG. 12b where the attenuation for the p-th clock harmonic is computed by comparing the largest spectral peak between the frequencies $p \cdot F_{clk} - F_{clk}/2$ and $p \cdot F_{clk} + F_{clk}/2$ to the spectral peak located at $p \cdot F_{clk}$ before clock frequency modulation.

Figure 13:
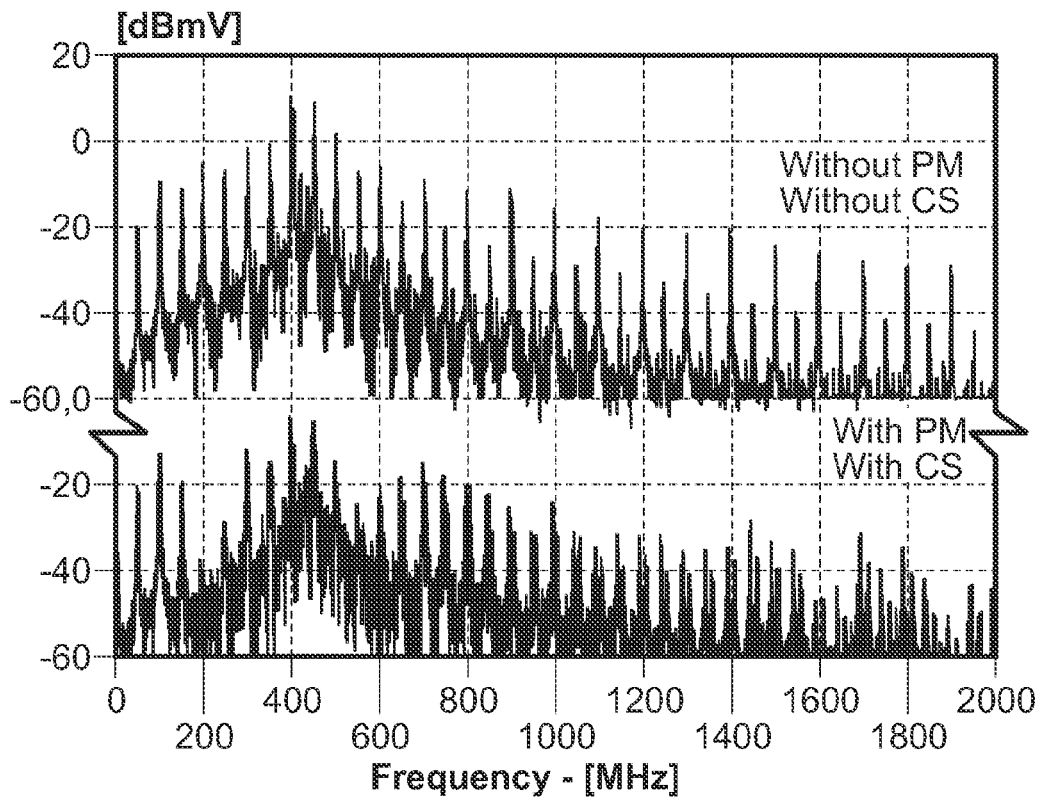
FIG. 13 is a ground bounce frequency-domain spectrum after phase modulation (PM) and intended clock skew (CS) for a 40K-gates telecom circuit.
Figure 14:
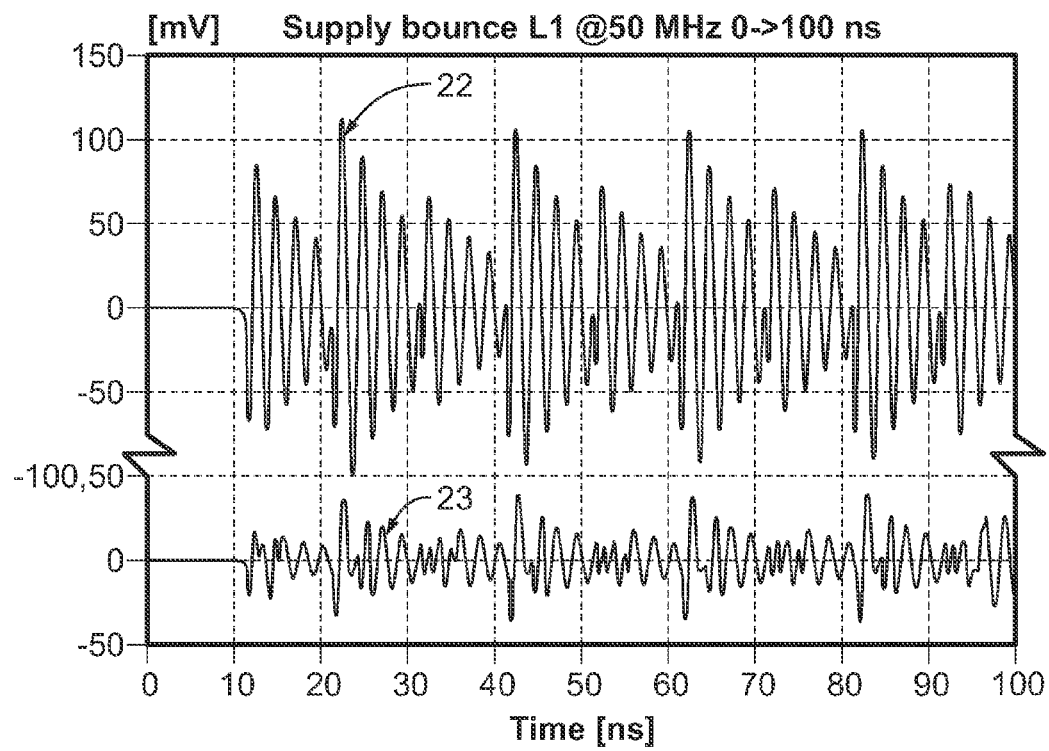
FIG. 14 is a ground bounce time-domain waveform after phase modulation (PM) and intended clock skew (CS) for a 40K-gates telecom circuit.

Furthermore, the combined impact of the clock phase modulation and intended clock skew in a large telecom circuit comprising 40K-gates has been tested. The circuit may be composed of a 20-bit maximum-length-sequence PRBS circuit driving the two-cascaded sets of the IQ modulator and demodulator chains. The number of flip-flops in the design may, according to this example, be 913. The design may have a clock period of 20 ns and supply line parasitics of 250 pH+0.025Ω. For this circuit, values of Cc=278 pF, Rch=0.028Ω, and Cch=159 pF are computed. The design may comprise four clock regions where the skew of each clock region has been optimized for less ground bounce [M. Badaroglu, M. van Heijningen, V. Gravot, J. Compiet, S. Donnay, G. Gielen, and H. De Man, "Methodology and experimental verification for substrate noise reduction in CMOS mixed-signal ICs with synchronous digital circuits," IEEE J. Solid-State Circuits, Vol. 37, No. 11, pp. 1383-1395, November 2002]. The supply current transfer function to the ground node has a resonance frequency at 421 MHz. This circuit is too complex to simulate with SPICE. Alternatively, a tool may be used to simulate the supply current and the generated ground bounce for 200 clock cycles [M. Badaroglu, M. van Heijningen, V. Gravot, J. Compiet, S. Donnay, G. Gielen, and H. De Man, "Methodology and experimental verification for substrate noise reduction in CMOS mixed-signal ICs with synchronous digital circuits," IEEE J. Solid-State Circuits, Vol. 37, No. 11, pp. 1383-1395, November 2002, and EP 0 1 201 000]. The simulated peak value of the supply current is reduced from 436 mA to 240 mA after the introduction of the intended clock skews. For this circuit, the reduction is around 16 dB around the resonance (FIG. 13) and a factor of 3.11 in the peak value of the ground bounce transients (FIG. 14) as a result of the phase modulation (PM) and intended clock skews (CS). FIG. 13 shows a ground bounce spectrum without PM and without CS (top curve) and a ground bounce spectrum with PM and with CS (bottom curve) for the 40K-gates telecom circuit. FIG. 14 shows a ground bounce time-domain waveform without PM and without CS (curve 22) and a ground bounce time-domain waveform with PM and with CS (curve 23) for the 40K-gates telecom circuit.

Figure 15:
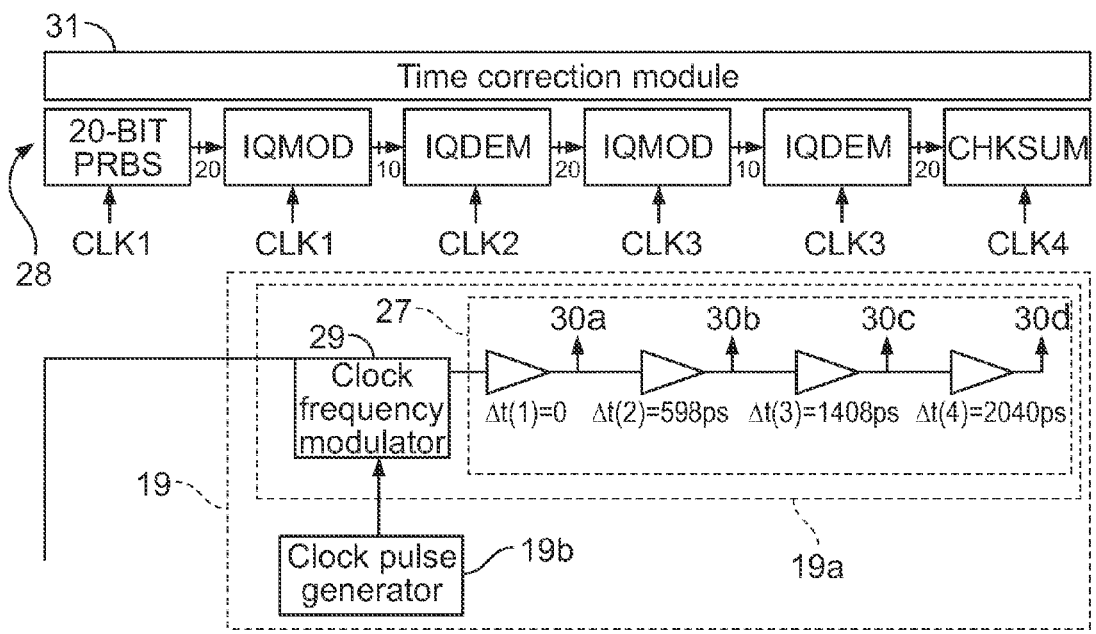
FIG. 15 is a block diagram of the 40K-gates telecom circuit.

In the following description, the combined impact of the clock-frequency modulation and the intentional clock skews will be tested in a slightly modified version of the 40K-gates telecom test circuit 28. The block diagram of the test circuit 28 together with the clock modulating circuit 19 are shown in FIG. 15. The clock modulating circuit 19 may, according to this example, comprise a clock spreading circuit 19a in the form of a delay controller 27 and a clock frequency modulator 29. A clock pulse generator 19b may be positioned externally or internally with respect to the clock spreading circuit 19a. The clock pulse generator 19b may, just as in the example given in FIG. 10, comprise a triangle waveform generator, a decrementing circuit and an incrementing circuit (not shown in the figure.) The macromodel element values and the parameters of the clock generator circuit 19b are summarized in Table 4 herebelow.

TABLE 4

Macromodel element values and parameters of the clock generator circuit for the circuit illustrated in FIG. 15.

| Macromodel element values | Parameters of the clock generator (frequency modulator) circuit |
|---|---|
| $L_{p(g)}$ = 0.2 nH | $P_{res}$ = 9 |
| $R_{p(g)}$ = 0.2 Ω | $\gamma$ = 0.084 |
| $C_c$ = 278 pF | $q_m$ = 0.7 |
| $R_{ch}$ = 0.028 Ω | $\beta$ = 6.23 |
| $C_{ch}$ = 159 pF | $m_{cycle}$ = 168 |
| | $\Delta t_{unit}$ = 20 ps |

The supply-current transfer function to the ground node may have a resonance frequency of 475 MHz. Therefore, the $9^{th}$ harmonic ($p_{res}$=9) was chosen in order to widely spread the spectral peak at this harmonic to the side lobes. To utilize the spreading for 70% of the spectrum ($q_m$=0.70) in the vicinity of the resonance frequency, α was computed to be 0.078 ($\gamma$=0.084) using eq. (27). By choosing a unit time step ($\Delta t_{unit}$) of 20 ps, β was computed to be 6.53 using eq. (30). With these parameters the frequency of the clock-modulating waveform becomes 119 KHz ($m_{cycle}$=168).

The design may comprise four clock regions 30a-d where the skew of each clock region 30a-d has been optimized (that is they can differ) for less ground bounce using the algorithm that will be described hereinafter. In that case, the spectrum bandwidth (corner frequency) of the supply current is 1.8 GHz. Choosing four clock regions 30a-d will guarantee that the resulting corner frequency is lower than the resonance frequency. The assignment of the combinatorial cells and the flip-flops to the clock regions 30a-d has been performed based on the partitioning of the functional units. Since the functional units are identical, each clock region 30a-d constructed in this way may contribute equally to the total supply current. The optimized clock network is also illustrated in FIG. 15. In order to correct the timing between the clock regions 30a-d, a time correction module 31 may be added, which may comprise delay buffers (not shown) on the data path between different clock regions 30a-d (FIG. 15).

Figure 16A:
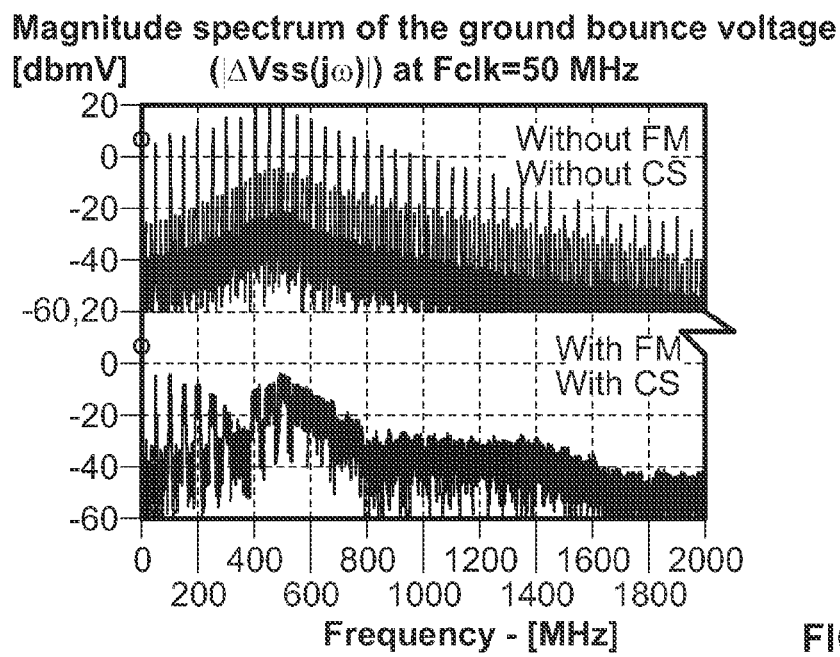
FIG. 16(a) is a ground bounce spectrum.
Figure 16B:
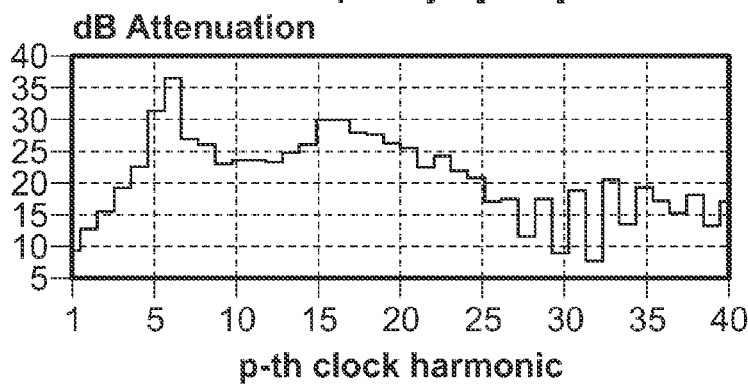
FIG. 16(b) shows the ground bounce reduction in dB in the spectral peaks.
Figure 16C:
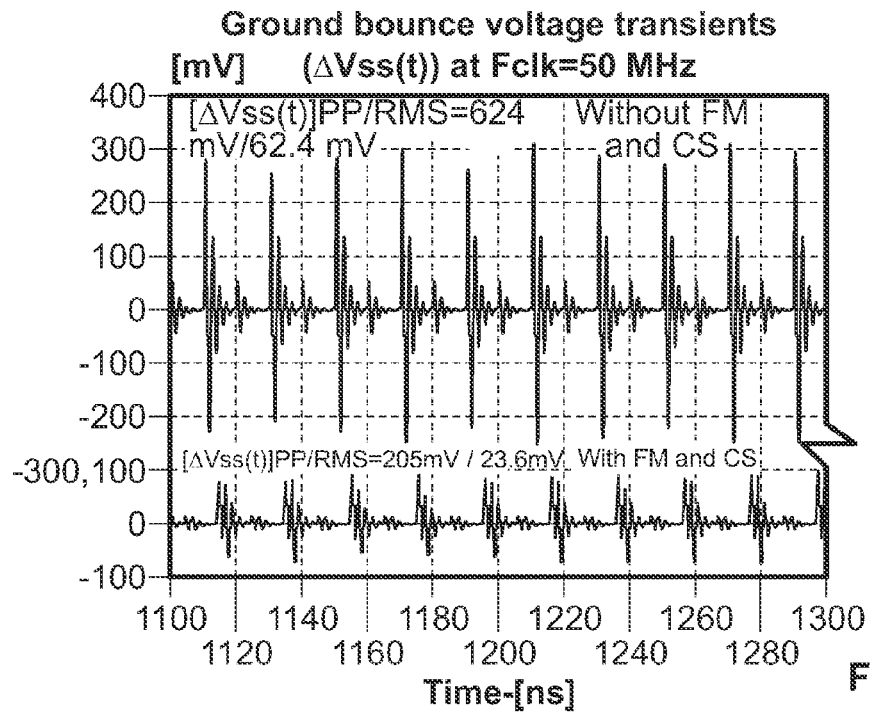
FIG. 16(c) shows ground bounce transients after intentional clock skews (CS) and frequency modulation (FM) for the 40K-gates telecom circuit with Fclk=50 MHz and $q_m$=0.7.

The overall impacts of the low-noise design techniques (CS: intentional clock skew and FM: frequency modulation) on the supply current and the ground bounce are summarized in Table 5. The simulated peak and RMS values of the supply current are respectively reduced by factors of 2.52× and 1.63× after the introduction of the intentional clock skews. These values do not change after clock frequency modulation. The amount of energy over 250 clock cycles does not change significantly due to introduction of the low-noise design techniques. The ground bounce reduction is greater than 6 dB, greater then 10 dB and is in fact about 26 dB at the circuit resonance in the frequency domain (FIG. 16a and FIG. 16b) and factors of 3.04× and 2.64× in the peak-to-peak and RMS values, respectively, in the time domain (FIG. 16c). This result is the combined effect of frequency modulation and intentional clock skews. In the ground bounce spectrum, local minima are visible around 350 MHz and 800 MHz after decreasing the spectrum bandwidth of the supply current by means of intentional clock skews. Around 350 MHz the reduction of the spectral peak is about 36.5 dB. It can be concluded that these techniques significantly reduce the ground bounce while having no significant increase in area and power.

TABLE 5

Effect of the low-noise design techniques on the supply current and the ground bounce for the 40K-gates telecom circuit simulated over 250 clock cycles with $F_{clk}$ = 50 MHz and $q_m$ = 0.7.

|  | None | CS | FM | FM and CS |
|---|---|---|---|---|
| $[i(t)]_P$ [mA] | 665 | 264 | 666 | 264 |
| $[i(t)]_{RMS}$ [mA] | 80.3 | 49.3 | 80.3 | 49.3 |
| $[i(t)]_{AVG}$ [mA] | 20.8 | 20.8 | 20.8 | 20.8 |
| Energy over 250 clock cycles [nJ] | 187.1 | 187.2 | 187.2 | 187.3 |
| $[\Delta v_{SS}(t)]_{PP}$ [mV] | 624 | 205 | 624 | 205 |
| $[\Delta v_{SS}(t)]_{RMS}$ [mV] | 62.4 | 23.6 | 62.4 | 23.6 |
| Attenuation of the ground bounce spectral peak |  |  |  |  |
| at 350 MHz [dB] | 0 | 30.4 | 15.7 | 36.5 |
| at 450 MHz [dB] | 0 | 11.1 | 16.6 | 26.0 |
| at 800 MHz [dB] | 0 | 25.5 | 14.3 | 30.1 |

From the above, it may be concluded that shaping the supply current is shown to be very effective for reducing the ground bounce caused by a digital circuit. Two supply current shaping techniques have been presented by certain embodiments:

(1) intentional clock skews in different parts of the circuit to reduce the bandwidth of the supply current and
(2) phase/frequency modulation of the clock to reduce the spectral peaks. This reduction in the spectral peaks will, for example, improve the bit-error-rate (BER) performance of the multi-carrier telecom systems when these spectral peaks are located in the information band.

To reduce the ground bounce, the properties of the modulating signal (period, shape, amplitude) are derived from the supply current and its transfer function to the digital ground node. Taking into account the cycle-to-cycle jitter and hardware cost, a triangular waveform as the modulating signal turns out to be the optimal choice. The parameters of the clock-modulating waveform and the clock skews have been computed using the representative supply current profile, which can be used as periodic pulses for the representation of the total supply current with an error bound and with a maximum frequency where this representation is valid. It has been found that in synchronous digital circuits, the discrete part of the ground-bounce PSD with its components at multiples of the digital clock frequency is more dominant. The discrete PSD is 10 dB in average above the continuous PSD, even when there is a 50% cycle-to-cycle variation on the peak value of the supply current.

The experimental results for a 40K-gates telecom circuit in a 0.18 µm 1.8 V CMOS process on a bulk-type substrate show that the ground bounce reduction is around 26 dB at the circuit resonance in the frequency domain and factors of 3.04× and 2.64× in the peak-to-peak and RMS values, respectively, in the time domain when both clock frequency modulation and intended clock skews are employed. These techniques prove to be efficient for the reduction of the ground bounce and therefore substrate noise coupling from the digital circuits to analog/RF circuits in mixed-signal integrated systems.

Hereinafter, the intentional clock skew to be used with certain embodiments will be discussed in more detail. The state-of-the-art on intentional clock skew for noise reduction suffers from a large number of drawbacks. For example:

(1) In prior approaches, the skew of every individual flip-flop was optimized. This creates a large power penalty due to increased number of glitches across timing regions and due to extra delay buffers when implementing the skew of a particular flip-flop as well as when fixing the hold-time violations between many timing regions.

(2) In prior approaches, the CPU time spent for optimising the skew of every individual flip-flop will be useless if these flip-flops are clustered into a small number of different clock regions.

By taking the above drawbacks into account, a clustering algorithm, for instance in accordance with some embodiments, should have the following features:

(1) It should be performed before the skew optimisation.
(2) It should target grouping the flip-flops by taking into account the supply current contribution of the flip-flop and its transitive fan-out.
(3) It should take timing constraints into account.

Up to now none of the previous approaches ['P. Vuillod, L. Benini, A. Bogliolo, and G. De Micheli, "Clock-skew optimization for peak current reduction," Proc. IEEE Int. Symp. on Low Power Electronics and Design, pp. 265-270, 1996' and 'A. Vittal, H. Ha, F. Brewer, and M. Marek-Sadowska, "Clock skew optimization for ground bounce control," Proc. ACM/IEEE Int. Conf. on Computer-Aided Design, pp. 395-399, 1996'] gives a minimum value for the number of the clock regions, which is set by the relation between the major resonance frequency of the circuit and the rise/fall time of the supply current. In this case, reducing the peak value of the supply current will not reduce ground bounce if the major resonance is located at a frequency, which lies inside the "passband" of the spectrum of the resulting supply current. The approach according to one embodiment also considers this before employing the skew optimization procedure.

The cost function used for the optimization of the clock skews also yields more accurate results as compared to previous work, which uses some mathematical functions based on a triangular approximation of the supply current. For synchronous systems, the spectrum of the substrate noise has peaks at multiples of the digital clock frequency. These peaks are shown to be the dominant components of the total supply current, just as was already stated previously. As a result, the optimization should be performed at each clock harmonic on the constraint space formed by the skews. This gives more optimal results. Additional constraints such as, for example, performance/race reliabilities of the clock are also introduced in the optimization in order to have a clock tree tolerant to process variations, have also been addressed to.

A clock skew optimization methodology according to an embodiment comprises four major steps:
(1) supply current folding,
(2) finding a minimum or required number of clock regions,
(3) assignment of the digital cells to the clock regions, and
(4) clock skew optimisation.

The different steps mentioned hereabove will be described in detail in the following discussion.

(1) Supply Current Folding

For run-time efficiency of the clock skew optimization methodology, it is not possible to use the complete transient data of the supply current over a long time period. In this section an algorithm will be presented to generate the representative supply current profile(s) for each of M current waveforms, with M being the number of clock regions. Each clock cycle is discretized into N time intervals. The presented algorithm assures a certain maximum error bound on the time-domain parameters $I_p$, $t_r$, and $t_f$ of the system supply current constructed by using the supply current profile(s) with respect to each cycle of the total supply current of each clock region. These representative supply current profiles may then be used to optimize the clock skews of the M clock regions.

The actual value of the supply current at the time point n (1 ... N), the clock region m (1 ... M), and the clock cycle r (1 ... R) are defined as i[n,m,r]. For each clock region, the union of the i[n,m,r] values may be compressed into a set of supply current profiles ($i_p$[n,m]), each having a single clock cycle representation. IP(m) may be given by:

$$IP(m) = \{\{i_1[n,m], k_1\}, \{i_2[n,m], k_2\}, \ldots, \{i_p[n,m], k_p\}, \ldots\}\} \text{ for } n = 1 \ldots N \quad (31)$$

wherein $k_p$ is the number of clock cycles used for the construction of each supply current profile $i_p$[n,m]. The number of supply current profiles in each clock region is constrained to be the same and it is dependent on the allowed error on the parameters of the total supply current.

The time-domain parameters $I_p(r)$, $t_r(r)$, and $t_f(fr)$, which respectively represent the peak value, the rise time, and the fall time at the clock cycle r (1 ... R) using the system supply current, may then be computed. The maximum allowed percentage variations of the peak value $I_p(r)$, the rise time ($t_r(r)$), and the fall time $t_f(r)$ of the actual supply current relative to the system supply current constructed by using the supply current profile(s) are respectively represented by $v_p$, $v_r$, and $v_f$. Using these error bounds, a supply current profile set was looked for, which matches the actual system supply current at the clock cycle r the best. If no such profile set exists, then an additional supply current profile for every clock region is generated using the actual supply current at the clock cycle r. The user specified error percentages $v_p$, $v_r$, and $v_f$ are chosen in a way to achieve a desired value for the ratio of the RMS value of the spectral peaks of the supply current to the RMS value of the continuous spectrum floor of the supply current (due to cycle-to-cycle variations).

The ratio between these RMS values is represented by η and is given by:

$$\eta^2 = \frac{1}{v_p^2/3 + v_{rf}^2/3 + v_p^2 \cdot v_{rf}^2/9} \quad (32)$$

wherein $v_{rf}$ is defined as the maximum percentage variation of the pulse width of the supply current, which is given by $v_{rf} = (v_r \cdot t_{rp} + v_f \cdot t_{fp})/(t_{rp} + t_{fp})$. The parameters $v_p$, $v_r$, and $v_f$ are the maximum allowed percentage variations defined earlier. The compression efficiency decreases when tightening $v_p$, $v_r$, and $v_f$.

Using the above procedure for each clock region, a set (IP(m)) of supply current profiles ($i_p$[n,m]) may be generated. From this set, the dominating supply current profile ($i_m$[n]) of the clock region m is selected as the one representing the largest number of clock cycles. In some cases, the profiles other than the dominating profile can represent a significant portion of the cycles. This may possibly be caused due to different operating modes or due to the intrinsic periodicity of the circuit. In the case of different operating modes, the substrate noise generation in each particular operating mode should be optimized using the profiles computed for this operating mode. In the case when the cycle-to-cycle variations have a known periodicity, we use a combination of the clock cycles to cover one period of the slowest clock.

(2) Finding a Minimum or Required Number of Clock Regions

The power spectrum of the supply current can be reduced by increasing $t_r$, $t_f$, and/or by decreasing $I_p$. This can be done by introducing different skews to the branches of a clock tree driving a synchronous digital circuit. This skew is realized by splitting the design into several clock regions and introducing skews for each clock region and to finally implement a clock delay line, which generates a separate clock for every clock region.

Figure 17:
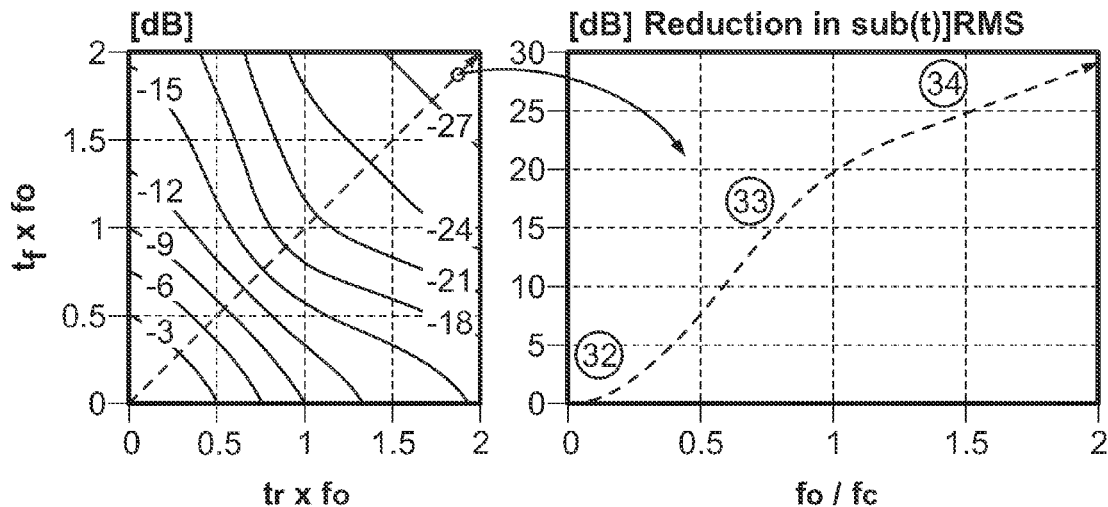
FIG. 17 shows the influence of the supply current rise/fall time on the substrate noise voltage in a 25K-gates circuit with a supply line inductance and a resistance of 0.1 nH and 10 mΩ respectively.

FIG. 17 illustrates the influence of $t_r$ and $t_f$ on the substrate noise voltage $V_{sub}$ in a 25K-gates circuit with a supply line inductance of 0.1 nH and a supply line resistance of 10 mΩ. The circuit has a resonance frequency ($f_o$) of 530 MHz and a damping factor of 0.19. The substrate noise voltage has been normalized to the origin. Three regions 32, 33, 34 may be distinguished:

(1) Region 32: In the case when $t_r$ and $t_f$ are small, $f_c$ is much larger than $f_o$ ($f_c >> f_o$). In the limit, the supply current is an impulse. In this region 32, the noise level is set by the power spectral density (PSD) of the supply current at the frequency of resonance ($f_o$) of the substrate noise transfer function. The PSD at $f_o$ does not change significantly by modifying $t_r$ and/or $t_f$.

(2) Region 33: By increasing $t_r$ and $t_f$, $f_c$ approaches $f_o$ ($f_c \sim f_o$) and the iso-reduction lines become closely spaced. $f_c$ starts to eliminate the resonance in the transfer function. The rate of reduction increases significantly because the main-lobe of the supply current is shifting out of the frequency of resonance.

(3) Region 34: Decreasing $f_c$ even more ($f_c < f_o$) makes the current waveform a band-limited signal. Here, the reduction is due to shrinking of the main-lobe. In the limit, the main-lobe becomes infinitely small, i.e. only static current consumption remains.

Without looking at the timing implications, the required minimum number of the clock regions M is found by the ratio of the corner frequency $f_c$ to the resonance frequency $f_o$. Choosing M or more clock regions will spread the supply current uniformly over a time period of M·max($t_r$,$t_f$)+min($t_r$, $t_f$). This then sets the new corner frequency of the supply current at a frequency lower than the resonance frequency. M is given by:

$$M = \frac{fc}{fo} = \frac{\sqrt{2Lpg \cdot (Cw + Cc + Cd)}}{\max(tr, tf)} \quad (33)$$

The actual rise/fall time ($t_r$, $t_f$) may be computed after a triangular approximation of the dominating supply current profile from the folding algorithm described earlier. Normally, the timing implications and the multiple peaks on the supply current will avoid having an optimum rise/fall time by using M or more clock regions. The clock skews must be computed in order to have the desired corner frequency using M clock regions.

(3) Assignment of the Digital Cells to the Clock Regions

After computing the number of clock regions, it is now necessary to decide which digital cell belongs to which clock region. Such assignment should balance the supply current contribution of each clock region for a significant reduction in the substrate noise generation. The assignment of N flip-flops into M clock regions is done in two steps:

(1) Assignment of the cells to the corresponding flip-flop ff(i) of the N flip-flops. This flip-flop is called the driving cell (the input/output port will also be treated as the driving cell). Each set is called FF(i). The rule of assigning a cell to a particular flip-flop is that the timing of this cell should be directly influenced with a skew introduced to this particular flip-flop.

(2) Partitioning N flip-flops into M clock regions, wherein typically N>>M.

The first step may be defined as partitioning combinatorial cells into the set FF(i), which is the set of all cells that have a timing dependency on the driving flip-flop ff(i), which is defined as the driving cell ff(i) of the set FF(i), and may also be called the flip-flop region i. The set FF(i) may also be called the transitive fanout of the driving cell ff(i). The union of all FF(i), which contains all the gates, may be defined by:

$$U = FF(1) \cup \ldots FF(i) \cup \ldots FF(j) \cup \ldots FF(N) \quad (34)$$

wherein N is the total number of flip-flops in the circuit U. It has to be noted that, in general, the intersection of two sets (FF(i) and FF(j)) may not be empty. In this case, the driving cell ff(i) may drive the cells, which have a timing dependency on another driving cell. We define the set Sf(i), which stores the indices of driving cells in the set FF(i). We first construct a directed graph of the cells connected to each other, where the driving cell ff(i) is the root of the graph.

Figure 18:
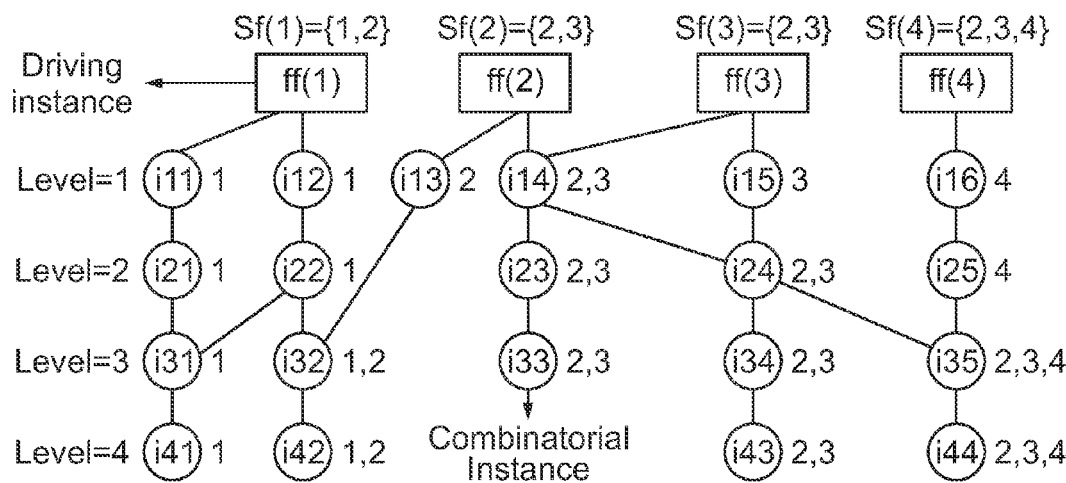
FIG. 18 illustrates the clustering of the combinatorial cells into the driving instances.

An example of the assignment procedure is shown in FIG. 18. In the figure the number(s) shown next to a combinatorial cell refers (refer) to the index (indices) of the driving cell(s). Initially, all the cells are set to the indices of the driving cells. This generates the following sets for the example shown in FIG. 18:

$$FF(1) = \{i11, i12, i21, i22, i31, i32, i41, i42\}$$

$$FF(2) = \{i13, i14, i23, i24, i32, i33, i34, i35, i42, i33, i34, i35, i42, i43, i44\}$$

$$FF(3) = \{i14, i15, i23, i24, i33, i34, i35, i43, i44\}$$

$$FF(4) = \{i16, i25, i35, i44\} \quad (35)$$

Figure 19:
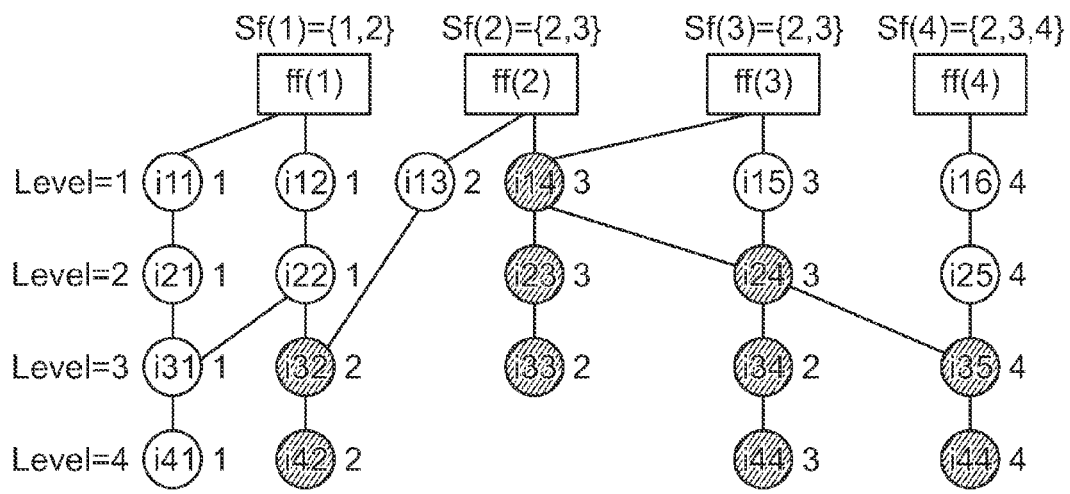
FIG. 19 illustrates the topological clustering procedure.

A cell is strictly an element of FF(i) when this cell belongs only to FF(i). These cells are called the "single-timed cells". Other cells, which are in the timing region of more than one driving flip-flop, are called the "multiple-timed cells". For the multiple-timed cells, a probability of switching may be assigned due to each of the driving flip-flops rather than assigning a unique index by means of a topological clustering procedure as illustrated in FIG. 19. In the figure, the circles shaded in grey correspond to the multiple-timed cells. The probabilities are computed using the results from a suitable model such as a VHDL-based switching activity simulator.

After the cell assignment, the sets FF(i) are grouped into appropriate clock regions such that their contributions into the total supply current are balanced as well as the contribution of multiple-timed cells to different clock regions is minimized. It is advantageous to reduce the multiple-timed cells across different clock regions as much as possible to reduce possible glitches, which cause an increase in power and signal integrity problems. If multiple-timed cells across different clock regions still exist, the supply current contribution of these cells is derived using the probabilities determined during the cell assignment. The assignment procedure also minimizes the hold-time constraints and data communication across different clock regions in order to relax timing constraints across different clock regions. This will also reduce the power overhead brought by extra buffers used for correcting the timing. Simulations show that the alternative approach of maximally spreading the multiple-timed cells over clock regions brings a large power penalty due to glitches.

The optimum assignment achieved by reducing the shared set of cells is not necessarily an optimum that targets at relaxing the placement/routing constraints during floor planning. On the other hand, the proposed scheme of grouping the cells close to the driving flip-flops is also a major objective for a generic clock network router.

(4) Clock Skew Optimisation

The clock skew optimization is based, for example, on an exhaustive search of all skews for a minimum value of the cost function, which will be described later in the skew optimization step.

Figure 20:
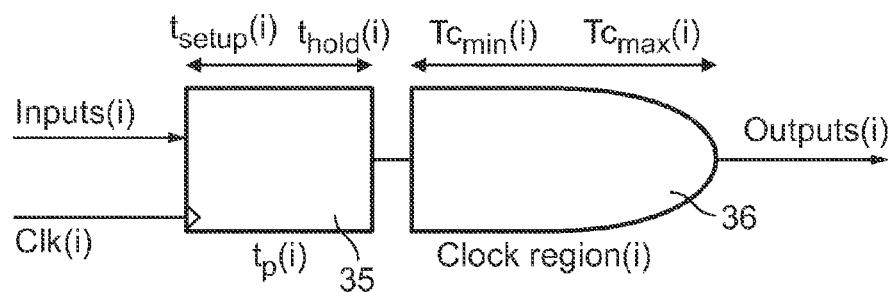
FIG. 20 illustrates the timing values for the i-th clock region.

The skews have to be constrained with the timing constraint parameters which are defined in FIG. 20, which illustrates the timing values for an ith clock region. Excessive negative skew may create a race condition, known as double clocking, which is the effect of the same clock pulse triggering the same data into two adjacent registers 35. This is prevented by keeping the clock skew $\Delta t(i,j) > -Tp_{min}(i,j)$. $Tp_{min}(i,j)$ is the minimum propagation delay of the datapath between two registers 35. On the other hand, excessive positive clock skew may limit the clock frequency, known as zero clocking; i.e. the data reaches reach a register 35 too late relative to the following active-clock edge. This may be prevented by $\Delta t(i,j) < T_{clk} - Tp_{max}(i,j)$, where $Tp_{max}(i,j)$ is the maximum propagation delay of the datapath between two registers 35. In FIG. 20, $t_{setup}(i)$ represents the set-up time of the registers 35 at clock region i, $t_{hold}(i)$ the hold time of the registers at the clock region i, $t_p(i)$ the propagation delay of the registers 35 at the clock region i, $Tc_{min}(i)$ the minimum delay of the combinatorial cells 36 after the registers 35 at the clock region i and $Tc_{max}(i)$ the maximum delay of the combinatorial cells 36 after the registers 35 at clock region i.

Figure 21:
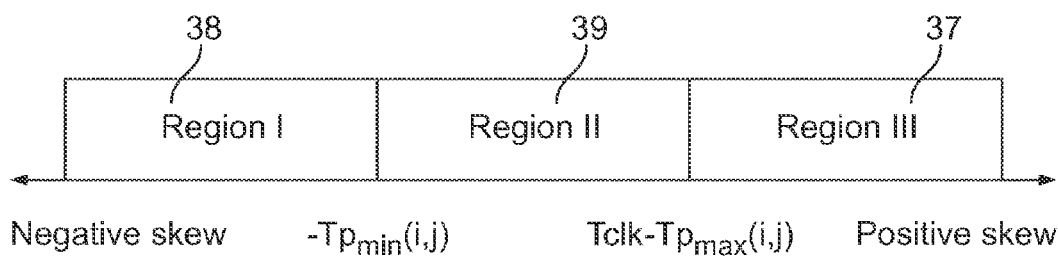
FIG. 21 illustrates permissible clock skew range.

The clock region i communicating with the clock region j has to satisfy the following constraints:

1) No zero clocking condition (set-up time constraint), as illustrated by region 37 in FIG. 21, because in that case performance problems can occur. Hence:

$$\Delta t(i,j) < (T_{clk} - tp_{max}(i,j)) \text{ where } tp_{max}(i,j) = t_p(i) + t_{setup}(j) + \delta - tc_{max}(i) \quad (36)$$

and

2) No double clocking condition (hold time constraint), as illustrated by region 38 in FIG. 21, because in that case race problems can occur. Hence:

$$\Delta t(i,j) > -tp_{min}(i,j) \text{ where } tp_{min}(i,j) = t_p(i) - t_{hold}(j) + tc_{min}(i) - \delta \quad (37)$$

In eq. (36) and eq. (37), $\Delta t(i,j)$ is the skew between the clock regions CR(i) and CR(j). $\delta$ is the clock uncertainty due to unintended skew coming from the clock interconnect respectively. For each technology, $\delta$ can be reduced by careful layouting and differential clocking techniques. The noise reduction factor can have a high sensitivity to this unintentional clock skew. Therefore, the impact of the unintentional skew on the ground bounce voltage (therefore substrate noise) should be checked. This will be explained later.

A timing model of the digital circuit is modeled, e.g. as a finite directed multi-graph G(V,E) that can be constructed using FIG. 20. Each vertex (v(i)) in the graph models the i-th clock region (CR(i)). Each edge (e(i,j)) in the graph represents the timing connection between the clock regions CR(i) and CR(j), with the maximum/minimum combinatorial path propagation delays $Tp_{max/min}$, where each clock region includes the register, the logic and the interconnect. These maximum/minimum delays are computed by using the analysis results of a static timing analysis.

The reliability of non-zero skews to the process variations has been introduced in 'J. L. Neves and E. G. Friedman, "Optimal clock skew scheduling tolerant to process variations," Proc. ACM/IEEE Design Automation Conf., pp. 623-628, June 1996' and in 'J. L. Neves and E. G. Friedman, "Design methodology for synthesizing clock distribution networks exploiting nonzero localized clock skew," IEEE Tr. VLSI Systems, Vol. 4, No. 2, pp. 286-291, June 1996'.

The two inequalities given by eq. (36) and eq. (37) define a region of permissible clock skew range 39 as shown in FIG. 21. An ideal clock skew, which is tolerant to the process variations, should preferably be at the center of this permissible range 39. The performance reliability of a circuit may in these terms be defined as the minimum of the distance from the skew to the upper bound of the permissible range 39 for all registers 35 in the circuit. Similarly, the race reliability is defined as the minimum of the distance from the lower bound of permissible range 39 to the skew for all registers 35 in the circuit. These two reliabilities indicate how good the performance/race reliability of the circuit is to the process variations and/or to the (un)intended skew. The performance reliability (PR) and the race reliability (RR) of a synchronous digital system may be defined as:

$$PR = \min(Tclk - Tp_{max}(i,j) - \Delta t(i,j))$$

$$RR = \min(\Delta t(i,j) + Tp_{min}(i,j)) \quad (38)$$

The performance and race reliabilities are used as constraints in the skew optimization, which are represented by $PR_{target}$ and $RR_{target}$ respectively.

Due to clock routing, due to load balancing or due to other random effects within different clock regions, there will be an unintended clock skew at each clock region 30a-d. The noise reduction factor can have a high sensitivity to this unintended clock skew. To analyze the quality of optimization results for unintended clock skew, a skew radius is constructed around the optimum point. For a given radius $\delta$, the space around the optimum is exhaustively searched. An indicator showing the max/average values of the reduction factor due to unintentional clock skew within the skew radius $\delta$ may be defined by:

$$SF_{MAX,RMS}(\delta) = \text{MAX,AVG}(\sqrt{f_{cost}(\Delta t_{opt} \pm r)/f_{cost}(0)}, \forall r \in [0,\delta]) \quad (39)$$

wherein $\Delta t_{opt}$ and r are the optimum skew bundle and the unintended skew on the optimized skews respectively, $f_{cost}(0)$ is the value of the cost function before the optimization.

Derivation of the Cost Function

The optimization procedure for the cost function is to find the best M skew bundle $(\Delta t(1), \Delta t(2), \ldots, \Delta t(m), \ldots, \Delta t(M))$ that gives the minimum value of the cost function using the supply current profiles shifted with the skews. $\Delta t(m)$ is defined as the skew value of clock region m. The minimum skew can be freely set to zero such that one of the clock regions 30a-d is aligned to the edge of the clock.

The optimization tries to minimize the spectral energy of the supply current, e.g. the RMS value of the ground bounce voltage or a similar parameter. The linearity property of the DFT allows to substitute the total supply current i(n) with the sum of the supply current spectra of different clock regions 30a-d. These spectra can be expressed as a function of their zero-delay spectra after a phase shift of $e^{-j(2\pi/N)n \cdot \Delta t(m)}$ to account for the delay $\Delta t(m)$. Consequently, the optimum skew $(\Delta t(1), \Delta t(2), \ldots, \Delta t(M))$ bundle should be found by using the evaluation of the cost function that is given by:

$$\sum_{n=0}^{N-1}\left(|h(n)|^2 \cdot \left|\sum_{m=1}^{M} i_m(n)e^{-j(2\pi/N)n \cdot \Delta t(m)}\right|^2\right) \quad (40)$$

wherein h(n) is the supply current transfer function to the ground bounce voltage. This transfer function can be easily derived by using the chip-level ground bounce model described earlier and illustrated in FIG. 1. In general, the total number of data points has to be reduced in order to make the optimization computationally feasible. For synchronous systems, the spectrum of ground bounce shows peaks, which are located at multiples of the digital clock frequency, are shown to be the dominant component of the total supply current. As a result, the optimization is performed at each clock harmonic p of the ensemble average supply current of each clock region 30a-d on the constraint space formed by the skews ($\Delta t(1)$, $\Delta t(2), \ldots, \Delta t(M)$). The cost function is given by:

$$\min_{\Delta t} f_{cost}(\Delta t(1), \Delta t(2), \ldots, \Delta t(M)) = \quad (41)$$

$$\sum_{p=0}^{(K-1)/2}\left(|H_{mean}(p)|^2 \left|\sum_{m=1}^{M} \mu_m(p) e^{-j(2\pi/K)p \cdot \Delta t(m)}\right|^2\right)$$

where $H_{mean}(p) = H(p \cdot n_{cycle})$ wherein $H_{sb,mean}[p] = H_{sb}[pR]$ is the supply current transfer function to the substrate noise voltage at the p-th harmonic in the frequency domain where R is the number of data points between two consecutive clock harmonics. The constraint space CS as a result of timing constraints is given by:

$$s \cdot t \cdot l_1 = 0,$$

$$-Tp_{min}(i,j) + RR_{target} < \Delta t(i) - \Delta t(j) < T_{cycle} - Tp_{max}(i,j) + PR_{target} \forall i,j \in [1,M] \times [1,M] \quad (42)$$

All possible values of the cost function $f_{cost}$ may be computed by means of eq. (41) by using the constraint space given by eq. (42). For the given bound $\delta$ of the unintended skew, the quality of the noise reduction may also be checked. The optimum skew bundle $\Delta t_{opt}$ may be determined based on the following relation:

Find $\Delta t_{opt} = (\Delta t(1), \Delta t(2), \ldots, \Delta t(M))$ $$\min(\max(f_{cost}(\Delta t(1) + \alpha, \Delta t(2) + \alpha, \ldots, \Delta t(M) + \alpha)))$$
$$s \cdot t \cdot \Delta t \in CS$$

where $\alpha = \{-\delta, 0, +\delta\}$ \quad (43)

The optimum skew bundle $\Delta t_{opt}$ may be determined after choosing a skew bundle giving the minimum worst penalty in the skew radius $\delta$. First, the best ten optimum skew bundles are to be found without considering the unintentional clock skew. Finally, the optimum skew bundle $\Delta t_{opt}$ is chosen by choosing the skew bundle that gives the minimum worst penalty in the skew radius $\delta$ (eq. (39)).

Figure 22:
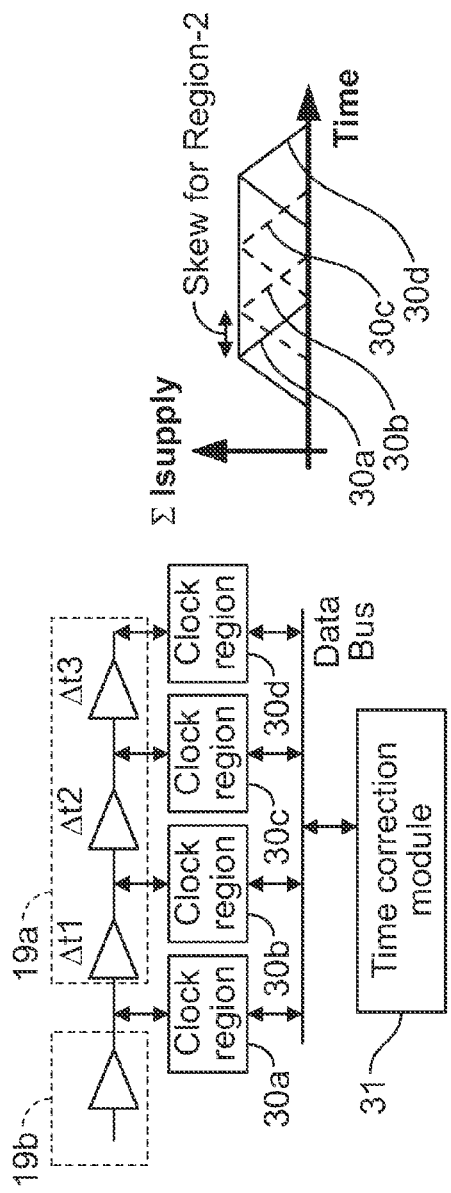
FIG. 22 illustrates an implementation of a clock tree with different skews (left) and construction of the supply current waveform under different skews (right).

The optimum skews may then be implemented using a clock delay line (FIG. 22). For a better reduction in the substrate noise voltage, it may sometimes be required to increase the search space for the optimum by allowing some hold-time violations. In this case, a time correction module 31, which may consist of delay buffers (not shown) on the data path of different clock regions 30a-d, can be used in order to correct for the timing violations. On the other hand, the constraints for set-up time case are not relaxed in the optimization. Therefore, the skew of each clock region 30a-d should have a timing budget such that no set-up violation exists. Here, the designer trades off the maximum operating frequency with the signal integrity. This trade-off becomes much easier in advanced technologies where the intrinsic transistor switching speed in many cases exceeds the application requirements significantly.

The overall computational complexity of the optimization methodology as well as the supply current folding methodology has a first-order dependency on the number of data points of the transient simulation. This comes as a result of using the compressed supply current waveforms.

Top-level routing of each clock net to the corresponding clock region 30*a-d* and data communication between different clock regions 30*a-d* are the only incremental changes to be done in the layout if timing constraints are not met. On the other hand, this uncertainty as a result of routing is reflected as a random parameter δ (eq. (39)) in the timing constraints. As a last check, the fidelity of the timing results should be checked with a hierarchical timing analysis performed on the boundaries of each clock region 30*a-d*.

The overhead in area and power for the implementation of clock skews is caused by extra circuits such as a clock delay line and (a limited amount of) data path buffers for fixing the timing. The theoretical bound on the power overhead ΔP (similarly for the area overhead ΔA) is given by:

$$\Delta P = \frac{\max(|\Delta t(i, j)|)}{T_{ds}} P_{ds} + \sum_{\substack{j=1 \\ j \neq i}}^{M} \sum_{i=1}^{M} \left( \frac{f(i, j) \cdot w(i, j) \cdot P_{dh}}{T_{dh}} + w(i, j) \cdot P_r(i, j) \right) \quad (44)$$

where $f(i, j) = -\Delta t(i, j)$ for $\Delta t(i, j) < 0$, otherwise $f(i, j) = 0$ The first term in the sum of eq. (44) is the power overhead in the clock delay line where $T_{ds}$ and $P_{ds}$ are the delay and the power, respectively, of the unit delay buffer for implementing the clock delay line. The second term in the sum of eq. (44) is the power penalty due to communication across different clock regions 30*a-d*. $T_{dh}$ and $P_{dh}$ are the delay and the power, respectively, of the unit delay buffer for fixing the hold-time violations between different clock regions. The term w(i,j) is the number of nets leaving from clock region i to clock region j and $P_r(i,j)$ is the power penalty due to long interconnects across different clock regions 30*a-d*. Since the cells are clustered in a way to reduce the shared set of cells across different timing regions, the second term may also be minimized.

The above can be summarized as follows. An efficient clock skew optimization methodology for reducing the ground bounce (therefore substrate noise) in large digital circuits has been introduced. The methodology splits the digital system in different clock regions 30*a-d* and optimizes the clock skews between the different clock regions 30*a-d* to reduce the substrate noise generation. The required number of clock regions 30*a-d* are computed based on the elimination of the major resonance frequency determined by the on-chip circuit capacitance and the supply line parasitics. The runtime of the optimization is improved by using supply current profiles, which can be used as periodic pulses for the representation of the total supply current. Additional constraints such as performance and race reliabilities have been introduced into the optimization in order to have a resulting clock tree tolerant to process variations.

Experimental results show a reduction of about a factor of two in the RMS value of the generated ground bounce voltage. The supply current shaping by the use of intentional clock skews has been shown to be very effective for reducing the substrate noise generation if timing constraints allow shaping.

Clock Phase Modulator Circuit

The technique of clock frequency modulation (SSCG) has been utilized in the phase-locked-loops (PLLs). However, the use of SSCG in a PLL system brings some additional timing constraints [N. J. Heredia, "Spread spectrum clock—an EMC solution for new generation portable computers," Proc. IEEE Int. Conf. on Electromagnetic and Compatibility, pp. 146-151, 2002]:

(1) cycle-to-cycle jitter and
(2) PLL tracking skew. The cycle-to-cycle jitter effect can be made negligible by employing a lower frequency spread, which compromises with the reduction efficiency, and by keeping the modulating frequency higher than 30 kHz. The PLL tracking skew can be minimised by increasing the feedback loop bandwidth of PLL and by minimizing the phase angle of the input-to-output transfer function of PLL at the modulation frequency. However, this may bring additional problems such as overshoot, which usually occurs during initial power-up. In order to avoid the overshoot problems in a PLL, a dual-loop spread spectrum clock generator is proposed in [H.-S. Li, Y.-C. Cheng, and D. Puar, "Dual-loop spread-spectrum clock generator," IEEE Int. Solid-State Circuits Conf. Digest of Tech. Papers, pp. 184-185, 459, February 1999]. The dual-loop SSCG uses a master PLL coupled with a slave modulation-voltage-locked loop (MVLL). The PLL generates a regular clock wave. The MVLL receives the timing and the lock-in voltage information from the master PLL and then generates the modulated voltage for the voltage-controller-oscillator (VCO) in the master PLL. In this circuit, it is vital for the MVLL to alter the clock frequency in a regular pattern, which highly depends on the synchronization of the two loops.

Figure 23:
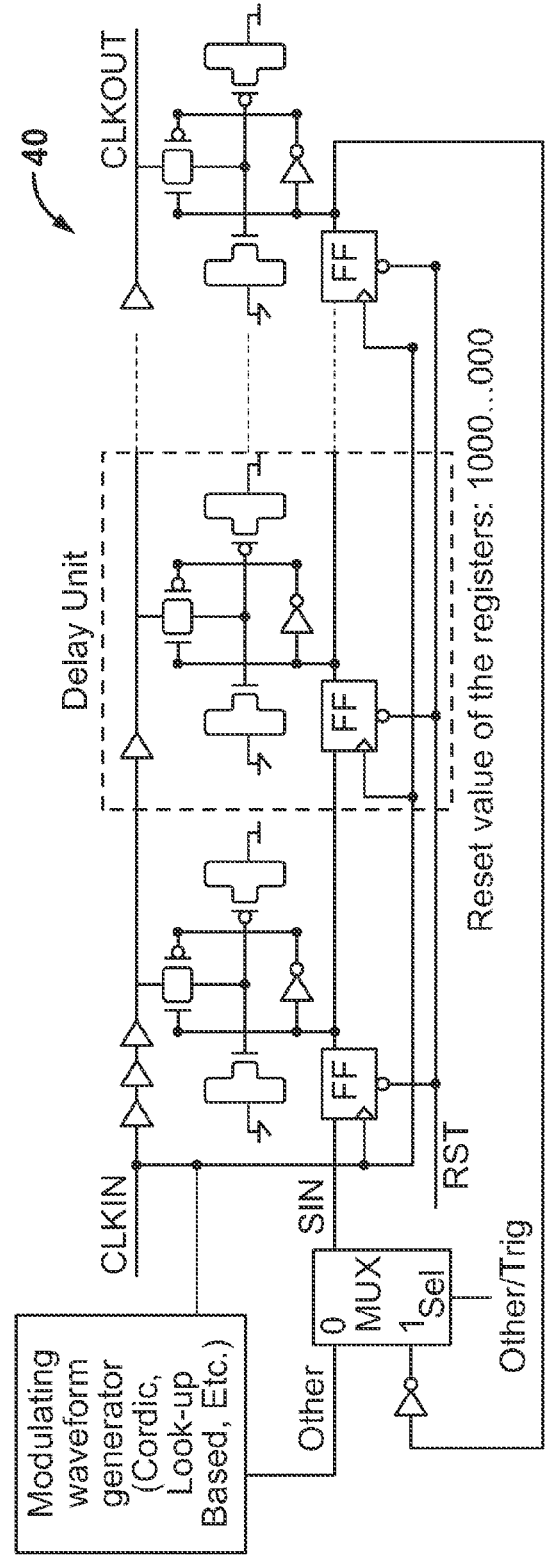
FIG. 23 shows a schematic of the clock phase/frequency modulator circuit.
Figure 24:
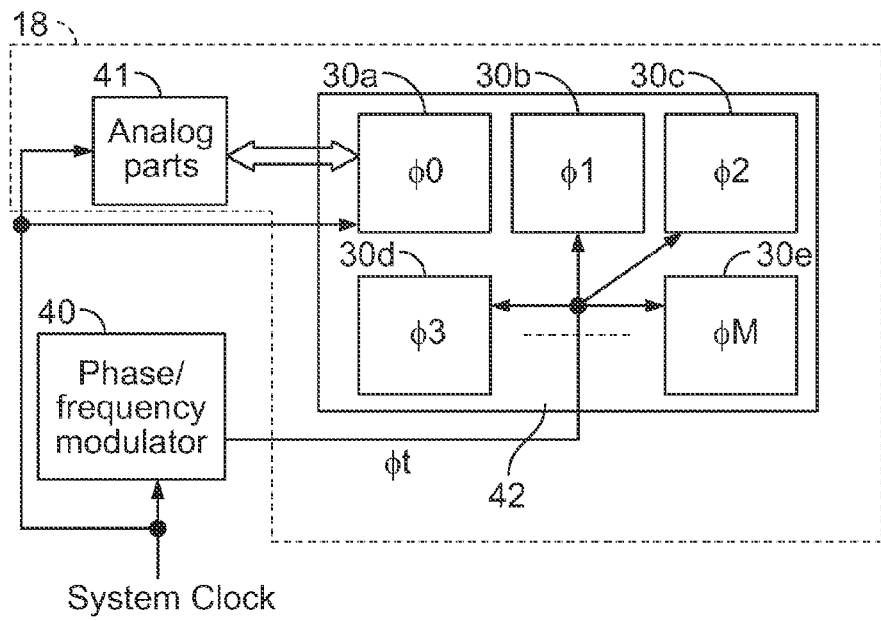
FIG. 24 shows an intended clock skew and clock frequency modulation in a synchronous system.
Figure 25:
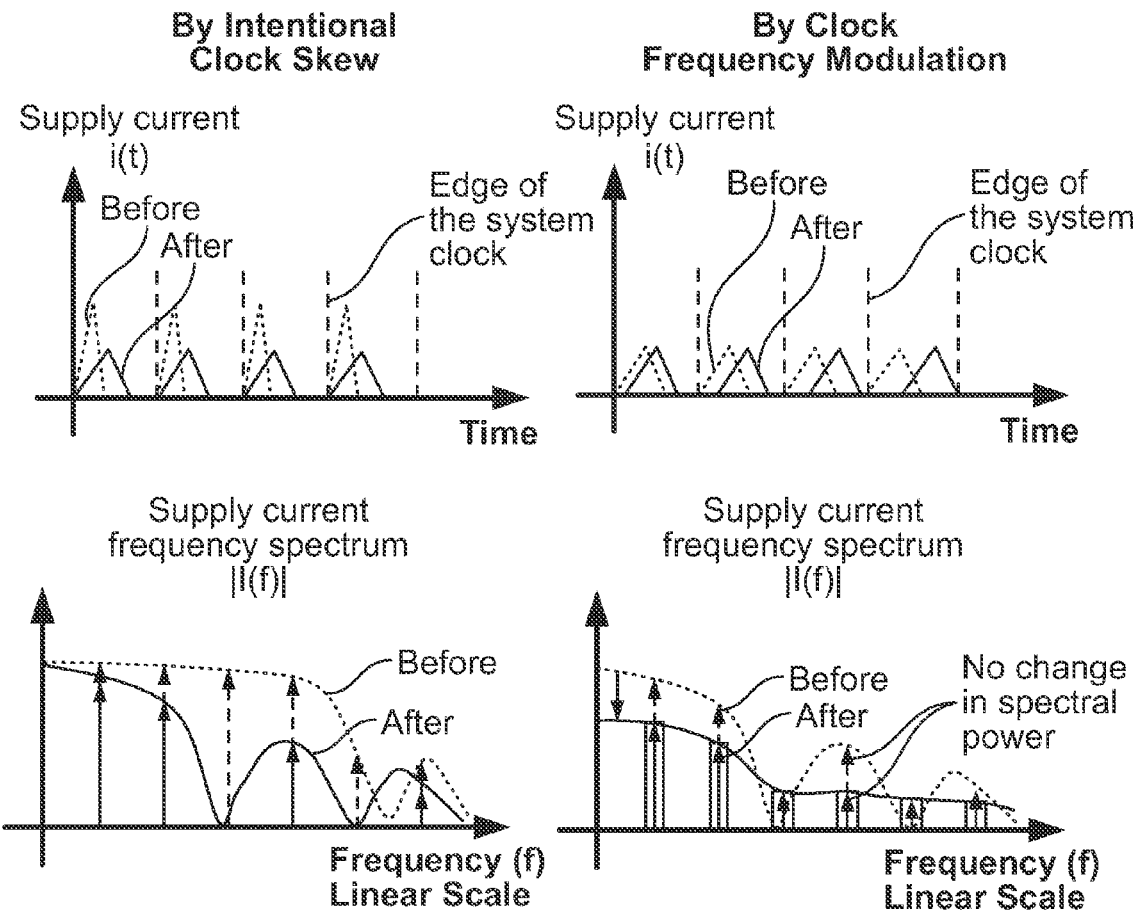
FIG. 25 illustrates the effect of the intentional clock skew and the clock phase/frequency modulation on the supply current in the time domain and in the frequency domain.

From the discussion above, it may be clearly seen that clock phase/frequency modulation requires special consideration when it utilizes the frequency-dependent modules, such as the phase-locked-loops (PLLs). Meanwhile, the circuit as proposed in some embodiments, which employs a controllable delay line, does not require such considerations since the clock is propagated through a feed-forward path. Such circuits have been used in recent microprocessors in order to control the skew of the clock tree network [S. Rusu, J. Stinson, S. Tam, J. Leung, H. Muljono, and B. Cherkauer, "A 1.5-GHz 130-nm Itanium 2 processor with 6-MB on-die L3 cache," IEEE J. Solid-State Circuits, Vol. 38, No. 11, pp. 1887-1895, November 2003]. In these approaches, the delay line is once programmed serially by a shift register in order to fix the skew of the clock. It does not dynamically change the phase of the clock delay line at each cycle in an effort to create the modulating waveform as it is done in our approach. The control signal is fed back to the beginning of the pipeline in order to create the required periodicity of the modulating waveform. A schematic of a clock phase/frequency modulator circuit 40 is shown in FIG. 23. The use of this phase/frequency modulator circuit 40 in a synchronous system, which also employs intentional clock skew, is shown in FIG. 24. This figure furthermore illustrates that the test circuit 18 (or the at least partially digital circuit) may also comprise analog parts 41. The digital sub-circuit 42 of which the influence on the other parts of the test circuit 18 has to be minimized according to some embodiments is split into different clock regions 30*a-e*. The impacts of these techniques on the supply current both in the time domain and in the frequency domain are shown in FIG. 25.

The phase/frequency modulator 40 may be realized by using an array of controllable skewing units. The delay line may be controlled by a serial control signal SIN, which is synchronized to the master clock. The signal SIN sets the total skew of the delay line. Due to high regularity of the delay line and the control logic, the layout of the phase/frequency modulator 40 is generated by a program without the need of a custom layout procedure. The clock with the required skew at each clock cycle is directly generated at the end of the line, therefore eliminating the need for selecting the clock from the output of a delay unit by means of a 1:N multiplexer where N is the number of the delay units. In fact, a multiplexer is not a feasible solution since N is typically larger than 32. This will require a large area for the multiplexer logic and will result in unbalanced skews inside the multiplexer. Therefore, the load of each delay unit is controlled by means of switches at each delay unit in order to overcome the difficulties of selecting the clock by a multiplexer.

The circuit inherently generates a triangular modulating waveform without a need for an external hardware. On the other hand, a digital signal-processing module (FIG. 23) is used in order to achieve other modulating waveforms. The control signal OTHER/TRIG selects either a triangular or another modulating waveform. The triangular modulating waveform may be generated by a special barrel shifter, which generates a stream of N times subsequent ones and zeros followed after each other. During reset, this shifter is reset to zero except the first flip-flop at the beginning of the shifter is set to one during. During the operation, the inverted output of the last flip-flop is fed back to the first flip-flop. Therefore, this creates an increasing/decreasing number of ones in the shifter at each clock cycle. When all the outputs of the flip-flops become one, the skew of the delay line is maximum. Similarly the skew becomes minimum when all the outputs of the flip-flops become zero. The unit/variable delay is controlled by sizing the transistors connected to the output of the transmission gate.

The design methods described above may be implemented on any suitable processor platform such as a personal computer, a workstation, a local area network, etc. Generally, a computer having a microprocessor and memory will be used with a graphical display such as a CRT screen, a flat format screen such as an LCD screen. A printer or plotter may also be attached to the computer for printing or plotting out the results. Also an inputting device will also generally be provided for inputting the circuit details and other parameters, e.g. via a keyboard, an optical or magnetic disk station such as a CD-ROM or DVD-Rom station, a diskette station or a hard drive.

It is to be understood that although certain embodiments, specific constructions and configurations, as well as materials, have been discussed herein for devices, various changes or modifications in form and detail may be made without departing from the scope and spirit of this invention.

What is claimed is:

1. A digital sub-circuit adapted for embedding in an at least partially digital circuit to minimize the influence of another digital sub-circuit on the at least partially digital circuit, the other digital sub-circuit being part of the at least partially digital circuit, the at least partially digital circuit further comprising an internal or external system clock for providing a clock signal having a phase and a frequency to the at least partially digital circuit, the digital sub-circuit comprising:
a clock modulating circuit, the clock modulating circuit comprising a phase/frequency modulating circuit configured to modulate the phase and/or frequency of the clock signal before the clock signal is applied to at least part of the at least partially digital circuit, the modulated clock signal being optimized in phase and/or frequency by an optimization process to minimize switching noise of the other digital sub-circuit on the at least partially digital circuit,
wherein the optimization process is based on minimizing a cost function, the cost function being a function of a supply current of the other digital sub-circuit.

2. The digital sub-circuit according to claim 1, wherein the clock modulating circuit further comprises a clock spreading circuit configured to introduce intentional clock skews, wherein the clock skews are optimized by an optimization process to minimize switching noise of the other digital sub-circuit on the at least partially digital circuit.

3. The digital sub-circuit according to claim 1, wherein a first part of the at least partially digital circuit uses a first clock signal and a second part of the at least partially digital circuit uses a second clock signal, the first and second clock signal being derived from the modulated clock signal and being shifted over a predetermined time with respect to each other.

4. The digital sub-circuit according to claim 1, wherein the at least partially digital circuit comprises an internal system clock, the internal system clock comprising a clock pulse generator which is part of the clock modulating circuit.

5. The digital sub-circuit according to claim 4, wherein the clock pulse generator comprises a triangle waveform generator.

6. The digital sub-circuit according to claim 1, wherein the phase/frequency modulating circuit comprises:
a control signal configured to set the amount of phase/frequency modulation;
a feed-forward path configured to phase/frequency modulate the clock signal; and
a feedback path for the control signal configured to realize the periodicity of the clock signal to be modulated.

7. The digital sub-circuit according to claim 1, wherein the phase/frequency modulating circuit is adapted for providing a dynamically changing phase/frequency.

8. The digital sub-circuit according to claim 6, wherein the phase/frequency modulating circuit is adapted for providing a dynamically changing phase/frequency.

9. The digital sub-circuit according to claim 6, wherein the phase/frequency modulating circuit comprises a multiplexer in the feedback path.

10. The digital sub-circuit according to claim 6, wherein the feed-forward path comprises a plurality of delay elements with selectable delay values.

11. The digital sub-circuit according to claim 8, wherein the feed-forward path comprises a plurality of delay elements with selectable delay values.

12. The digital sub-circuit according to claim 10, wherein the control signal is being used for selecting the delay values.

13. The digital sub-circuit according to claim 11, wherein the control signal is being used for selecting the delay values.

14. An at least partially digital circuit comprising:
a clock signal module configured to generate or input a system clock for providing a clock signal having a phase and a frequency to the at least partially digital circuit,
a first digital sub-circuit being part of the at least partially digital circuit, and a second digital sub-circuit configured to minimize switching noise of the first digital sub-circuit on the at least partially digital circuit,
wherein the second digital sub-circuit comprises a clock modulating circuit, the clock modulating circuit comprising a phase/frequency modulating circuit configured to modulate the phase and/or frequency of the clock signal before the clock signal is applied to at least part of the at least partially digital circuit, the modulated clock signal being optimized in phase and/or frequency by an optimization process to minimize switching noise of the first digital sub-circuit on the at least partially digital circuit, wherein the optimization process is based on minimizing a cost function, the cost function being a function of a supply current of the first digital sub-circuit.

15. The at least partially digital circuit according to claim 14, wherein the clock modulating circuit further comprises a clock spreading circuit configured to introduce intentional clock skews, wherein the clock skews are optimized by an optimization process to minimize switching noise of the first digital sub-circuit on the at least partially digital circuit.

16. The at least partially digital circuit according to claim 15, wherein a first part of the at least partially digital circuit uses a first clock signal and a second part of the at least partially digital circuit uses a second clock signal, the first and second clock signal being derived from the modulated clock signal and being shifted over a predetermined time with respect to each other.

17. The at least partially digital circuit according to claim 14, the at least partially digital circuit comprising an internal system clock, wherein the internal system clock comprises a clock pulse generator which is part of the clock modulating circuit.

18. The at least partially digital circuit according to claim 17, wherein the clock pulse generator comprises a triangle waveform generator.

19. The at least partially digital circuit according to claim 14, wherein the phase/frequency modulating circuit comprises:
a control signal configured to set the amount of phase/frequency modulation;
a feed-forward path configured to phase/frequency modulate the clock signal; and
a feedback path for the control signal configured to realize the periodicity of the clock signal to be modulated.

20. The at least partially digital circuit according to claim 14, wherein the phase/frequency modulating circuit is adapted for providing a dynamically changing phase/frequency.

21. The at least partially digital circuit according to claim 19, wherein the phase/frequency modulating circuit is adapted for providing a dynamically changing phase/frequency.

22. The at least partially digital circuit according to claim 19, wherein the phase/frequency modulating circuit comprises a multiplexer in the feedback path.

23. The at least partially digital sub-circuit according to claim 19, wherein the feed-forward path comprises a plurality of delay elements with selectable delay values.

24. The at least partially digital sub-circuit according to claim 21, wherein the feed-forward path comprises a plurality of delay elements with selectable delay values.

25. The at least partially digital sub-circuit according to claim 23, wherein the control signal is being used for selecting the delay values.

26. The at least partially digital sub-circuit according to claim 24, wherein the control signal is being used for selecting the delay values.

27. The at least partially digital circuit according to claim 14, wherein the at least partially digital circuit comprises a multi-carrier telecom circuit, a signal processing circuit, or a microprocessor.

28. A method of minimizing the influence of a first digital sub-circuit on an at least partially digital circuit, the first digital sub-circuit being part of the at least partially digital circuit, the method comprising:
determining optimal system-level clocking conditions for a clock signal to be applied to the at least partially digital circuit, in order to minimize switching noise of the first digital sub-circuit to the at least partially digital circuit; and
providing a second digital sub-system for adapting the clock signal according to the determined system-level clocking conditions before applying the clock signal to the at least partially digital circuit,
wherein the determining of system-level clocking conditions comprises:
determining from the behavior of the at least partially digital circuit over a first number of cycles an average behavior of the at least partially digital circuit over a second number of cycles, the second number being substantially smaller than the first number, and
determining the system-level clocking conditions directly from the average behavior.

29. The method according to claim 28, wherein the system-level clocking conditions comprises parameters of a phase/frequency modulation of the clock signal of the at least partially digital circuit.

30. The method according to claim 29, wherein the system-level clocking conditions further comprise parameters for a skew and time shift to be applied to a second phase/frequency modulated clock signal applied to a second part of the at least partially digital circuit with respect to a first phase/frequency modulated clock signal applied to a first part of the at least partially digital circuit.

31. The method according to claim 28, wherein determining optimal system-level clocking conditions comprises:
providing a cost function for determining optimal system-level clocking conditions, the cost function being a function of a supply current of the first digital sub-circuit,
providing a constraint space,
minimizing the cost function within the constraint space so as to determine optimal skews.

32. The method according to claim 28, wherein the average behavior is characterized as a representative supply current.

33. The method according to claim 28, wherein the determining of optimal system-level clocking conditions for a clock signal to be applied to the at least partially digital circuit comprises calculating switching noise of the first digital sub-circuit and repeating the step for various system-level clocking conditions by using an optimizer.

34. The method according to claim 28, wherein the switching noise of the digital sub-circuit to the at least partially digital circuit is determined by the effect of switching of the digital sub-circuit on other parts of the at least partially digital circuit.

35. The method according to claim 34, wherein the effect of switching of the digital sub-circuit on other parts of the at least partially digital circuit comprises substrate noise, electromagnetic coupling (EMC) and/or ground noise.

36. An at least partially digital circuit comprising:
means for generating or inputting a system clock for providing a clock signal having a phase and a frequency to the at least partially digital circuit;
a first digital sub-circuit being part of the at least partially digital circuit;
means for modulating the clock signal before the clock signal is applied to at least part of the at least partially digital circuit, the modulated clock signal being optimized in phase and/or frequency by an optimization process to minimize switching noise of the first digital sub-circuit on the at least partially digital circuit,
wherein the optimization process is based on minimizing a cost function, the cost function being a function of a supply current of the first digital sub-circuit.

37. The circuit of claim 36, wherein the minimizing means comprises a second digital sub-circuit.

38. The circuit of claim 36, wherein the minimizing means comprises a clock modulating circuit, the clock modulating circuit comprising a phase/frequency modulating circuit for modulating the phase and/or frequency clock signal before the clock signal is applied to at least part of the at least partially digital circuit, the modulated clock signal being optimized to thereby minimize the influence of the first digital sub-circuit on the at least partially digital circuit.

* * * * *